(12) United States Patent
Nebesnyi

(10) Patent No.: US 10,446,223 B1
(45) Date of Patent: Oct. 15, 2019

(54) DATA STORAGE APPARATUS, AND RELATED SYSTEMS AND METHODS

(71) Applicant: BitFury Group Limited, George Town, Grand Cayman (KY)

(72) Inventor: Valerii Nebesnyi, Kiev (UA)

( * ) Notice: Subject to any disclaimer, the term of this patent is extended or adjusted under 35 U.S.C. 154(b) by 0 days.

(21) Appl. No.: 16/116,519

(22) Filed: Aug. 29, 2018

(51) Int. Cl.
| G11C 11/41 | (2006.01) |
| G11C 11/412 | (2006.01) |
| G11C 11/419 | (2006.01) |
| G11C 5/14 | (2006.01) |
| G11C 11/4074 | (2006.01) |
| G11C 7/10 | (2006.01) |
| G11C 11/408 | (2006.01) |

(52) U.S. Cl.
CPC ........... *G11C 11/412* (2013.01); *G11C 5/147* (2013.01); *G11C 7/1039* (2013.01); *G11C 11/4074* (2013.01); *G11C 11/4085* (2013.01); *G11C 11/419* (2013.01)

(58) Field of Classification Search
CPC . G11C 11/412; G11C 11/4085; G11C 7/1039; G11C 5/147; G11C 11/419; G11C 11/4074
See application file for complete search history.

(56) References Cited

U.S. PATENT DOCUMENTS

| 6,510,076 | B1 | 1/2003 | Lapadat et al. |
| 6,744,661 | B1 | 6/2004 | Shubat |
| 6,804,143 | B1 | 10/2004 | Hobson |
| 6,975,532 | B1 | 12/2005 | Kosonocky et al. |
| 7,164,596 | B1 | 1/2007 | Deng et al. |
| 7,177,177 | B2 | 2/2007 | Chuang et al. |
| 7,257,017 | B2 | 8/2007 | Liaw |
| 7,306,988 | B1 | 12/2007 | Avanzino et al. |
| 7,324,368 | B2 | 1/2008 | Wang et al. |
| 7,355,906 | B2 | 4/2008 | Joshi et al. |
| 7,365,432 | B2 | 4/2008 | Liaw |
| 7,400,523 | B2 | 7/2008 | Houston |
| 7,471,544 | B2 | 12/2008 | Nakazato et al. |
| 7,483,332 | B2 | 1/2009 | Houston |
| 7,499,312 | B2 | 3/2009 | Matick et al. |

(Continued)

FOREIGN PATENT DOCUMENTS

| JP | 6002693 B2 | 10/2016 |
| WO | WO-2008/118294 A1 | 10/2008 |

(Continued)

*Primary Examiner* — Mohammed A Bashar
(74) *Attorney, Agent, or Firm* — Goodwin Procter LLP

(57) ABSTRACT

The reliability of a low-power SRAM device fabricated in a small process node can be improved by using an SRAM cell with circuitry that reduces or eliminates contention between pull-up and pull-down devices during write operations. In the first stage of a write operation, the node N that stores the SRAM cell's bit value may be decoupled from a power-supply rail ("Rail 1") by deactivating one type of "pulling" device (e.g., the type of pulling device that can pull the voltage of node N toward the voltage of Rail 1). Using pulling device(s) of the opposite type, the voltage of node N may then be pulled toward the voltage of the other power-supply rail ("Rail 2"). In this manner, the new SRAM cell may reduce or eliminate contention between pull-up and pull-down devices at node N during the first stage of the write operation.

30 Claims, 12 Drawing Sheets

(56) References Cited

U.S. PATENT DOCUMENTS

| | | | |
|---|---|---|---|
| 7,643,357 | B2 | 1/2010 | Braceras et al. |
| 7,671,422 | B2 | 3/2010 | Wang |
| 7,672,152 | B1 | 3/2010 | Kulkarni et al. |
| 7,706,174 | B2 | 4/2010 | Pradhan et al. |
| 7,738,283 | B2 | 6/2010 | Wong |
| 7,808,812 | B2 | 10/2010 | Liu et al. |
| 7,826,251 | B2 | 11/2010 | Chang et al. |
| 7,885,092 | B2 | 2/2011 | Uematsu |
| 7,898,875 | B2 | 3/2011 | Tao et al. |
| 7,907,461 | B1 | 3/2011 | Nguyen et al. |
| 8,004,907 | B2 | 8/2011 | Russell et al. |
| 8,072,797 | B2 | 12/2011 | Sachdev et al. |
| 8,111,542 | B2 | 2/2012 | Wu et al. |
| 8,120,975 | B2 | 2/2012 | Kenkare et al. |
| 8,294,212 | B2 | 10/2012 | Wang et al. |
| 8,320,164 | B2 | 11/2012 | Chuang et al. |
| 8,345,469 | B2 | 1/2013 | Pelley et al. |
| 8,363,453 | B2 | 1/2013 | Arsovski et al. |
| 8,385,140 | B2 | 2/2013 | Dreesen et al. |
| 8,437,178 | B2 | 5/2013 | Chiu et al. |
| 8,451,652 | B2 | 5/2013 | Seikh et al. |
| 8,503,221 | B1 | 8/2013 | Hobson et al. |
| 8,531,873 | B2 | 9/2013 | Teman et al. |
| 8,625,333 | B2 | 1/2014 | Rao et al. |
| 8,630,132 | B2 | 1/2014 | Cheng et al. |
| 8,654,575 | B2 | 2/2014 | Deng |
| 8,730,713 | B2 | 5/2014 | Garg et al. |
| 8,958,236 | B2 | 2/2015 | Wuu et al. |
| 8,971,097 | B2 | 3/2015 | Ngo et al. |
| 8,988,960 | B2 | 3/2015 | Huang et al. |
| 8,995,208 | B2 | 3/2015 | Jung et al. |
| 9,183,922 | B2 | 11/2015 | Yang et al. |
| 9,230,637 | B1 | 1/2016 | Butt et al. |
| 9,281,054 | B2 | 3/2016 | Huang et al. |
| 9,336,861 | B1 | 5/2016 | Moharir |
| 9,355,710 | B2 | 5/2016 | Gong et al. |
| 9,496,047 | B2 | 11/2016 | Yang et al. |
| 9,542,992 | B2 | 1/2017 | Lin et al. |
| 9,646,681 | B1 * | 5/2017 | Jung ................ G11C 11/4125 |
| 2009/0161410 | A1 | 6/2009 | Houston |
| 2009/0298238 | A1 | 12/2009 | Cho |
| 2010/0097844 | A1 | 4/2010 | Liu |
| 2010/0142258 | A1 | 6/2010 | Tsai et al. |
| 2011/0103137 | A1 | 5/2011 | Beat |
| 2012/0063211 | A1 | 3/2012 | Sharma et al. |
| 2012/0314486 | A1 | 12/2012 | Yoshimoto et al. |
| 2013/0188434 | A1 * | 7/2013 | Puckett ................ G11C 7/00 365/189.16 |
| 2013/0242645 | A1 | 9/2013 | Calhoun et al. |
| 2014/0003132 | A1 | 1/2014 | Kulkarni et al. |
| 2014/0098596 | A1 | 4/2014 | Poulton et al. |
| 2014/0136778 | A1 | 5/2014 | Khailany et al. |
| 2014/0160871 | A1 | 6/2014 | Zimmer et al. |
| 2014/0204657 | A1 | 7/2014 | Dally |
| 2015/0043270 | A1 | 2/2015 | Singh et al. |
| 2015/0103604 | A1 | 4/2015 | Sheikh et al. |
| 2015/0179232 | A1 | 6/2015 | Felix et al. |
| 2015/0200006 | A1 | 7/2015 | Wang et al. |
| 2015/0206576 | A1 | 7/2015 | Gong et al. |
| 2015/0235695 | A1 | 8/2015 | Chen et al. |
| 2015/0235696 | A1 | 8/2015 | Wang et al. |
| 2016/0078926 | A1 | 3/2016 | Kolar et al. |
| 2016/0141022 | A1 | 5/2016 | Kulkarni et al. |

FOREIGN PATENT DOCUMENTS

| | | |
|---|---|---|
| WO | WO-2011133356 A1 | 10/2011 |
| WO | WO-2013048625 A1 | 4/2013 |
| WO | WO-2014100607 A1 | 6/2014 |
| WO | WO-2014185923 A1 | 11/2014 |

* cited by examiner

DATA STORAGE APPARATUS, AND RELATED SYSTEMS AND METHODS

FIELD OF INVENTION

The present disclosure relates generally to data storage systems and techniques. Some implementations relate specifically to static random access memory (SRAM) devices that operate robustly and reliably at low power supply voltages, even in the presence of substantial process variations.

BACKGROUND

Static random access memory (SRAM) is a type of semiconductor memory commonly used to implement fast, low-power storage devices, including registers and primary caches of microprocessors, memories of mobile devices (e.g., mobile phones), etc. An SRAM device generally includes one or more SRAM cells (e.g., an array of SRAM cells), each of which stores the value of a bit. The value of an SRAM cell's bit is written to the cell during a write operation and is read from the cell during a read operation. When idle, an SRAM cell generally consume very little power.

FIG. 1 illustrates a schematic of a five-transistor ("5T") SRAM cell 100. The 5T SRAM cell 100 includes a bistable latch 110, which is formed using two CMOS inverters (120, 130). These inverters are cross-coupled, such that the output 126 of the first inverter 120 is coupled to the input 138 of the second inverter 130, and the output 136 of the second inverter 130 is coupled to the input 128 of the first inverter 120. The 5T SRAM cell 100 stores the value of its bit at the output 126 of the first inverter, and stores the inverse bit value at the output 136 of the second inverter.

The first CMOS inverter 120 includes a p-channel metal oxide semiconductor (MOS) field effect transistor (FET) (pFET) 122 and an n-channel MOSFET (nFET) 124. The gates of the pFET 122 and nFET 124 are coupled together at the input 128 of the first inverter 120, and the drains of the pFET 122 and nFET 124 are coupled together at the output 126 of the first inverter 120. Likewise, the second CMOS inverter 130 includes a pFET 132 and an nFET 134, with the gates of the pFET 132 and nFET 134 coupled together at the input 138 of the second inverter 130, and with the drains of the pFET 132 and nFET 134 coupled together at the output 136 of the second inverter 130. The sources of the pFETs (122, 132) are coupled to a first power supply rail 112 (which may provide a power supply voltage Vdd), and the sources of the nFETs (124, 134) are coupled to a second power supply rail 114 (which may provide a ground voltage Vss).

In addition, the 5T SRAM cell 100 includes an access FET 140, which controls access to the value of the SRAM cell's bit during read and write operations. The gate of the access FET 140 is coupled to a word line 160. One diffusion terminal of the access FET 140 is coupled to the node 126 that stores the value of the SRAM cell's bit, and the other diffusion terminal of the access FET 140 is coupled to a bit line 150.

In the example of FIG. 1, during a read operation, the access transistor 140 is activated (e.g., by driving a logic-1 value onto the word line 160), thereby coupling the bit line 150 to the output 126 of the inverter 120. The inverter 120 then drives the bit value of the cell 100 onto the bit line 150. During a write operation, the access transistor 140 is activated and the bit value to be written into the cell 100 is driven onto the bit line 150 by a memory controller.

If the bit value being written into the cell 100 differs from the bit value already stored in the cell, a write operation can lead to contention between a pull-up device and a pull-down device. For example, if the cell 100 already stores a logic-0 value at node 126, and a memory controller attempts to write a logic-1 value into the cell 100, a pull-up device in the memory controller attempts to pull up the potential of the node 126 toward Vdd, while the nFET 124 attempts to maintain the node's logic-0 value by pulling down the potential of the node 126 toward Vss. In a well-designed memory system, the sizes and drive strengths of the devices in the SRAM cells, array, and controller are generally set such that the devices used to write bit values into the SRAM cells can reliably overpower the devices within the SRAM cell, such that bit values can be reliably written into the SRAM cells.

Reducing the power consumption of SRAMs and many other computing devices generally reduces the cost of operating such devices and tends to extend the battery life of mobile devices. One common approach to reducing a device's power consumption is to reduce the power supply voltage provided to the device, thereby lowering the device's dynamic power consumption and leakage current. In some cases, the supply voltage to a device may be reduced to the threshold region (e.g., reduced to a value roughly equal to the threshold voltage of the device's transistors) or even to the sub-threshold region (e.g., reduced to a value below the threshold voltage of the device's transistors).

In addition to reducing power consumption, lowering a device's power supply voltage can also reduce the device's reliability by making the device's performance more susceptible to process variation. During the fabrication of an integrated circuit ("IC" or "chip"), naturally occurring variations in the fabrication process can lead to variations in the parameters of the chip's transistors, including channel width, channel length, drive strength, oxide thickness, etc. The sensitivity of transistor parameters to process variation tends to increase as the size of the process node decreases, because the variation in a parameter's value becomes a larger percentage of the parameter's nominal value as the dimensions of the transistor's parameters decrease. In addition, the sensitivity of circuit parameters to process variation tends to increase as the circuit's supply voltage decreases. The impact of process variation on the overall performance of a device can be particularly significant at process nodes smaller than 65 nm and/or when the device's transistors are operated in the sub-threshold region. In some cases, process variation can cause conventional SRAM systems and operations to fail.

SUMMARY OF THE INVENTION

When SRAM devices are fabricated using small process nodes (e.g., 65 nm or smaller) and operated at low power supply voltages (e.g., near-threshold or sub-threshold voltages), the SRAM devices may not operate reliably. For example, at low supply voltages, the process variation associated with a small process node can cause write operations in the 5T SRAM cell 100 of FIG. 1 to fail. Such write failure can occur, for example, because process variation renders the access transistor 140 and/or the drive transistors in the SRAM's controller too weak to overpower the latch 110 during a write operation. Thus, there is a need for SRAM devices that can operate reliably at low power supply voltages (e.g., near-threshold or sub-threshold supply voltages), even when fabricated using small process nodes (e.g., 65 nm or smaller) and subjected to the process variation generally associated with such process nodes.

The inventors have recognized and appreciated that the reliability of a low-power SRAM device fabricated in a small process node can be improved by using a new SRAM cell with circuitry that reduces or eliminates contention between pull-up and pull-down devices during write operations. In some embodiments, the SRAM cell performs write operations in two stages. In the first stage, the node N of the SRAM cell that stores the cell's bit value may be decoupled from one of the cell's power-supply rails ("Rail 1") by deactivating one type of the cell's "pulling" devices (i.e., the type of pulling device that is operable to pull the voltage of the node N toward the voltage of Rail 1). Using one or more pulling devices of the opposite type, the voltage of the node N may then be pulled toward the voltage of the other power-supply rail ("Rail 2"). In this manner, the new SRAM cell may reduce or eliminate contention between pulling devices of different types (e.g., pull-up and pull-down devices) at node N during the first stage of the write operation.

For example, in the first stage, the cell's pull-down device(s) may be deactivated, such that node N is decoupled from the cell's ground rail and no pull-down device in the cell is operable to pull down the voltage of node N toward the cell's ground voltage Vss, and the voltage of node N may be pulled up toward the cell's power supply voltage Vdd via one or more pull-up devices, thereby storing a logic-1 value at node N. Alternatively, in the first stage, the cell's pull-up device(s) may be deactivated, such that node N is decoupled from the cell's power-supply rail and no pull-up device in the cell is operable to pull up the voltage of node N toward the cell's supply voltage Vdd, and the voltage of the node N may be pulled down toward the cell's ground voltage Vss via one or more pull-down devices, thereby storing a logic-0 value at node N.

In the second stage of the write operation, the node N may be decoupled from Rail 2 by deactivating the pulling device(s) of the type used to write the cell's bit value during the first stage. If the bit value B2 being written to the cell during the second stage of the write operation differs from the bit value B1 that was written during the first stage, the pulling device(s) of the opposite type may be used during the second stage to pull the voltage of node N toward the voltage of Rail 2, which corresponds to the bit value B2. Otherwise, both types of pulling device(s) may be inactive during the second stage, and the node may continue to store the bit value B1. In this manner, the new SRAM cell may reduce or eliminate contention between pulling devices of different types (e.g., pull-up and pull-down devices) at node N during the second stage of the write operation.

For example, in the second stage, the cell's pull-up devices may be deactivated, such that node N is decoupled from the cell's power-supply rail and no pull-up device in the cell is operable to pull up the voltage of node N toward the cell's power supply voltage Vdd. If a logic-0 value is being written to the cell, the voltage of node N may then be pulled down toward the cell's ground voltage Vss via the one or more pull-down devices. Otherwise, the logic-1 value of node N may remain unchanged. Alternatively, node N may be decoupled from the cell's pull-down devices in the second stage, such that node N is decoupled from the cell's ground rail and no pull-down device in the cell is operable to pull down the voltage of node N toward the cell's ground voltage Vss. If a logic-1 bit value being written to the cell, the voltage of node N may then be pulled up toward the cell's power supply voltage Vdd via the one or more pull-up devices. Otherwise, the logic-0 bit value of node N may remain unchanged.

In general, one innovative aspect of the subject matter described in this specification can be embodied in a static random-access memory (SRAM) cell (200), including: a latch (210) operable to store a bit value at a first node (212), the latch including first and second devices each having a first voltage reference node (214) coupled to a first power supply rail (270) and a second voltage reference node (216) coupled to a second power supply rail (272); a switch (250) coupled to the first node, wherein a bit line (284) of the SRAM cell is coupled to the first node through first and second terminals of the switch, and a word line (282) of the SRAM cell is coupled to a control terminal of the switch; a first pulling device (240) of a first type, wherein the second voltage reference node of the first device of the latch is coupled to the second power supply rail via first and second terminals of the first pulling device; and a second pulling device (220) of a second type, wherein the first node is coupled to the first power supply rail via first and second terminals of the second pulling device, wherein a control line (280) is coupled to respective control terminals of the first and second pulling devices.

Other embodiments of this aspect include corresponding arrays of SRAM cells, memory devices that include one or more of the SRAM cells, other electronic devices that include one or more of the SRAM cells, and methods of operating the SRAM cell and/or devices that include one or more of the SRAM cells.

The foregoing and other embodiments can each optionally include one or more of the following features, alone or in combination. The second pulling device may be operable to selectively pull a voltage of the first node toward a voltage of the first power supply rail. The first pulling device may be operable to selectively pull a voltage of the second voltage reference node of the first device of the latch toward a voltage of the second power supply rail. The SRAM cell may further include a third pulling device of the second type, wherein the first voltage reference node of the first device of the latch is coupled to the first power supply rail via first and second terminals of the third pulling device. The third pulling device may be operable to selectively pull a voltage of the first voltage reference node of the first device of the latch toward a voltage of the first power supply rail.

In some embodiments, a difference between an electrical potential of the first power supply rail and an electrical potential of the second power supply rail is less than a threshold voltage of at least one device selected from the group consisting of the switch, the first pulling device, the second pulling device, and the third pulling device. In some embodiments, the latch includes a plurality of transistors, and the difference between the electrical potential of the first power supply rail and the electrical potential of the second power supply rail is less than a threshold voltage of at least one transistor included in the plurality of transistors.

In some embodiments, the first type of pulling device is a pull-down type and the second type of pulling device is a pull-up type. In some embodiments, the second pulling device (220*u*) includes a p-channel field effect transistor (pFET) (222*u*), wherein the first node is coupled to the first power supply rail (270*d*) via a source and a drain of the pFET, and wherein the control line is coupled to a gate of the pFET. In some embodiments, the pFET is operable to selectively pull up a voltage of the first node toward a voltage of the first power supply rail. In some embodiments, the first pulling device (240*d*) includes an n-channel field effect transistor (nFET) (242d), wherein the second voltage reference node of the first device of the latch is coupled to the second power supply rail via a source and a drain of the nFET, and wherein the control line is coupled to a gate of the nFET. In some embodiments, the nFET is operable to selectively pull down a voltage of the second voltage reference node of the first device of the latch toward a voltage of the second power supply rail.

In some embodiments, the SRAM cell further includes a third pulling device (230u) of the second type, wherein the third pulling device includes a pFET (232u), and wherein the first voltage reference node of the first device of the latch is coupled to the first power supply rail via a source and a drain of the pFET. In some embodiments, the word line is coupled to the gate of the pFET. In some embodiments, the pFET is operable to selectively pull up a voltage of the first voltage reference node of the first device of the latch toward a voltage of the first power supply rail. In some embodiments, the switch (250a) includes an nFET (252n), wherein the bit line is coupled to the first node via a source and a drain of the nFET, and wherein the word line is coupled to a gate of the nFET. In some embodiments, the voltage of the first power supply rail represents a bit value of logic-1, and wherein the voltage of the second power supply rail represents a bit value of logic-0.

In some embodiments, the first type of pulling device is a pull-up type and the second type of pulling device is a pull-down type. In some embodiments, the second pulling device (220d) includes an n-channel field effect transistor (nFET) (222d), wherein the first node is coupled to the first power supply rail (270s) via a source and a drain of the nFET, and wherein the control line is coupled to a gate of the nFET. In some embodiments, the nFET is operable to selectively pull down a voltage of the first node toward a voltage of the first power supply rail. In some embodiments, the first pulling device (240u) includes a p-channel field effect transistor (pFET) (242u), wherein the second voltage reference node of the first device of the latch is coupled to the second power supply rail (272d) via a source and a drain of the pFET, and wherein the control line is coupled to a gate of the pFET. In some embodiments, the pFET is operable to selectively pull up a voltage of the second voltage reference node of the first device of the latch toward a voltage of the second power supply rail.

In some embodiments, the SRAM cell further including a third pulling device (230d) of the second type, wherein the third pulling device includes an nFET (232d), and wherein the first voltage reference node of the first device of the latch is coupled to the first power supply rail via a source and a drain of the nFET. In some embodiments, the word line is coupled to the gate of the nFET. In some embodiments, the nFET is operable to selectively pull down a voltage of the first voltage reference node of the first device of the latch toward a voltage of the first power supply rail. In some embodiments, the switch (250b) includes a pFET (252p), wherein the bit line is coupled to the first node via a source and a drain of the pFET, and wherein the word line is coupled to a gate of the pFET. In some embodiments, the voltage of the first power supply rail represents a bit value of logic-0, and wherein the voltage of the second power supply rail represents a bit value of logic-1.

In some embodiments, the latch is bistable. In some embodiments, the first device (205a) includes a first inverter and the second device (205b) includes a second inverter, and the first and second inverters are cross-coupled. In some embodiments, an output of the first inverter (218a) is coupled to an input of the second inverter (218b) at the first node, and an output (219b) of the second inverter is coupled to an input of the first inverter (219a) at a second node.

In general, another innovative aspect of the subject matter described in this specification can be embodied in a static random-access memory (SRAM) cell, including: a first plurality of field-effect transistors (FETs) of a first type, including first, second, third, and fourth FETs; and a second plurality of field-effect transistors (FETs) of a second type, including fifth, sixth, seventh, and eighth FETs, wherein a first diffusion terminal, second diffusion terminal, and gate of the fifth FET (232) are coupled, respectively, to a first power supply rail (270), a first diffusion terminal of the sixth FET (211), and a word line (282), wherein a second diffusion terminal and gate of the sixth FET (211) are coupled, respectively, to a first node (212) and a second node (219), wherein a first diffusion terminal, second diffusion terminal, and gate of the first FET (213) are coupled, respectively, to the first node (212), a first diffusion terminal of the second FET (242), and the second node (219), wherein a second diffusion terminal and gate of the second FET (242) are coupled, respectively, to a second power supply rail (272) and a control line (280), wherein a first diffusion terminal, second diffusion terminal, and gate of the third FET (252) are coupled, respectively, to a bit line (284), the first node (212), and the word line (282), wherein a first diffusion terminal, second diffusion terminal, and gate of the seventh FET (222) are coupled, respectively, to the first power supply rail (270), the first node (212), and the control line (280), wherein a first diffusion terminal, second diffusion terminal, and gate of the eighth FET (215) are coupled, respectively, to the first power supply rail (270), the second node (219), and the first node (212), and wherein a first diffusion terminal, second diffusion terminal, and gate of the fourth FET (217) are coupled, respectively, to the second node (219), the second power supply rail (272), and the first node (212).

Other embodiments of this aspect include corresponding arrays of SRAM cells, memory devices that include one or more of the SRAM cells, other electronic devices that include one or more of the SRAM cells, and methods of operating the SRAM cell and/or devices that include one or more of the SRAM cells.

The foregoing and other embodiments can each optionally include one or more of the following features, alone or in combination. A difference between an electrical potential of the first power supply rail and an electrical potential of the second power supply rail may be less than a threshold voltage of at least one FET selected from the group consisting of the first and second pluralities of FETs.

In some embodiments, the first type of FET is an n-channel FET (nFET) and the second type of FET is a p-channel FET (pFET). In some embodiments, a voltage of the first power supply rail (270d) represents a bit value of logic-1, and a voltage of the second power supply rail (272s) represents a bit value of logic-0. In some embodiments, the first and second pluralities of FETs are operable to store a bit value at the first node in response to receiving a sequence of control signals, wherein receiving the sequence of control signals includes: (a) receiving logic-0 values on the control line and the word line during a first time period, and (b) subsequent to step (a), receiving logic-1 values on the control line and the word line during a second time period, and receiving the bit value on the bit line during the second time period. In some embodiments, receiving the sequence of control signals further includes: prior to step (a), receiving a logic-1 value on the control line and a logic-0 value on the word line during a third time period.

In some embodiments, the first type of FET is a p-channel FET (pFET) and the second type of FET is an n-channel FET (nFET). In some embodiments, a voltage of the first power supply rail (270s) represents a bit value of logic-0, and a voltage of the second power supply rail (272d) represents a bit value of logic-1. In some embodiments, the first and second pluralities of FETs are operable to store a bit value at the first node in response to receiving a sequence of control signals, wherein receiving the sequence of control signals includes: (a) receiving logic-1 values on the control line and the word line during a first time period, and (b) subsequent to step (a), receiving logic-0 values on the control line and the word line during a second time period, and receiving the bit value on the bit line during the second time period. In some embodiments, receiving the sequence of control signals further includes: prior to step (a), receiving a logic-0 value on the control line and a logic-1 value on the word line during a third time period.

In general, another innovative aspect of the subject matter described in this specification can be embodied in a method of storing a bit value in a static random-access memory (SRAM) cell. The SRAM cell may include a latch (210) and a switch (250), the latch being operable to store the bit value at a first node (212), the latch including first and second devices each having a first voltage reference node (214) coupled to a first power supply rail (270) and a second voltage reference node (216) coupled to a second power supply rail (272), a bit line (284) of the SRAM cell being coupled to the first node through first and second terminals of the switch, and a word line (282) of the SRAM cell being coupled to a control terminal of the switch. The method may include: (a1) decoupling the second voltage reference node of the first device from the second power supply rail; (a2) pulling a voltage of the first node toward a voltage of the first power supply rail; (b1) coupling the second voltage reference node of the first device to the second power supply rail; (b2) decoupling the first voltage reference node of the first device from the first power supply rail; and (b3) coupling the bit line to the first node, wherein a voltage of the bit line represents the bit value, wherein steps a1 and a2 are performed at least partially in parallel, wherein steps b1, b2, and b3 are performed at least partially in parallel, and wherein steps a1 and a2 are performed prior to steps b1, b2, and b3.

Other embodiments of this aspect include corresponding SRAM cells and arrays of SRAM cells operable to perform the actions of the method, memory controllers operable to control one or more SRAM cells to perform the actions of the method, and electronic devices that include such SRAM cells and/or memory controllers.

The foregoing and other embodiments can each optionally include one or more of the following features, alone or in combination. Steps a1, a2, b1, b2, and b3 may collectively be performed in a time period between approximately 167 ps and approximately 200 ps. Pulling the voltage of the first node toward the voltage of the first power supply rail (270d) may include pulling up the voltage of the first node. The voltage of the first power supply rail may represent a bit value of logic-1 and a voltage of the second power supply rail may represent a bit value of logic-0. In some embodiments, the bit value is a logic-0 value, and the actions of the method further include: after coupling the bit line to the first node, pulling down the voltage of the first node to a logic-0 value. In some embodiments, pulling up the voltage of the first node toward the voltage of the first power supply rail includes pulling up the voltage of the first node to a voltage representing a logic-1 value. In some embodiments, the bit value is a logic-1 value, and the actions of the method further include: after coupling the bit line to the first node, maintaining the voltage of the first node at a voltage representing a logic-1 value. In some embodiments, the bit value is a logic-1 value, and the actions of the method further include: after coupling the bit line to the first node, pulling up the voltage of the first node to a voltage representing a logic-1 value.

In some embodiments, the SRAM cell further includes a first pulling device of a first type and a second pulling device of a second type, the second voltage reference node of the first device of the latch is coupled to the second power supply rail via first and second terminals of the first pulling device, the first node is coupled to the first power supply rail via first and second terminals of the second pulling device, a control line is coupled to respective control terminals of the first and second pulling devices, and steps a1 and a2 are performed in response to receiving, during a first time period, a logic-0 value on the control line and a logic-0 value on the word line. In some embodiments, steps b1, b2, and b3 are performed in response to receiving, during a second time period subsequent to the first time period, a logic-1 value on the control line and a logic-1 value on the word line.

In some embodiments, pulling the voltage of the first node toward the voltage of the first power supply rail includes pulling down the voltage of the first node. In some embodiments, the voltage of the first power supply rail represents a bit value of logic-0 and a voltage of the second power supply rail represents a bit value of logic-1. In some embodiments, the bit value is a logic-1 value, and the actions of the method further include: after coupling the bit line to the first node, pulling up the voltage of the first node to a logic-1 value. In some embodiments, pulling down the voltage of the first node toward the voltage of the first power supply rail includes pulling down the voltage of the first node to a voltage representing a logic-0 value. In some embodiments, the bit value is a logic-0 value, and the actions of the method further include: after coupling the bit line to the first node, maintaining the voltage of the first node at a voltage representing a logic-0 value. In some embodiments, the bit value is a logic-0 value, and the actions of the method further include: after coupling the bit line to the first node, pulling down the voltage of the first node to a voltage representing a logic-0 value.

In some embodiments, the SRAM cell further includes a first pulling device of a first type and a second pulling device of a second type, the second voltage reference node of the first device of the latch is coupled to the second power supply rail via first and second terminals of the first pulling device, the first node is coupled to the first power supply rail via first and second terminals of the second pulling device, a control line is coupled to respective control terminals of the first and second pulling devices, and steps a1 and a2 are performed in response to receiving, during a first time period, a logic-1 value on the control line and a logic-1 value on the word line. In some embodiments, steps b1, b2, and b3 are performed in response to receiving, during a second time period subsequent to the first time period, a logic-0 value on the control line and a logic-0 value on the word line.

In general, another innovative aspect of the subject matter described in this specification can be embodied in a static random-access memory (SRAM) device, including an array (500) of SRAM cells (200) organized in rows (510) and columns (520). Each of the SRAM cells may include: a latch operable to store a bit value at a first node, the latch including first and second devices each having a first voltage reference node coupled to a first power supply rail and a second voltage reference node coupled to a second power supply rail, a switch coupled to the first node, a bit line coupled to the first node through first and second terminals of the switch, a word line coupled to a control terminal of the switch, a first pulling device of a first type, wherein the second voltage reference node of the first device of the latch is coupled to the second power supply rail via first and second terminals of the first pulling device, a second pulling device of a second type, wherein the first node is coupled to the first power supply rail via first and second terminals of the second pulling device, and a control line coupled to respective control terminals of the first and second pulling devices. The SRAM device may further include: a plurality of column lines (550), each column line corresponding to a respective column of the SRAM cells and coupled to the bit lines of the SRAM cells in the respective column; a plurality of row lines (560), each row line corresponding to a respective row of the SRAM cells and coupled to the word lines of the SRAM cells in the respective row; a plurality of write lines (570), each write line corresponding to a respective row of the SRAM cells and coupled to the control lines of the SRAM cells in the respective row; and a memory controller (610) coupled to the SRAM array via the column lines, row lines, and write lines.

Other embodiments of this aspect include electronic devices that include the SRAM device, and methods of operating the SRAM device and/or devices that include the SRAM device.

The foregoing and other embodiments can each optionally include one or more of the following features, alone or in combination. In some embodiments, the SRAM cells include a first SRAM cell coupled to the memory controller via a first of the column lines, a first of the row lines, and a first of the write lines, and the memory controller is operable to store a bit value in the first SRAM cell by: (a) setting bit values of the first word line and the first write line to a first value for a first period of time, and (b) subsequent to step (a), setting bit values of the first word line and the first write line to a second value different from the first value for a second period of time, wherein the bit value is present on the first column line during step (b).

Particular implementations of the subject matter described in this specification can realize one or more of the following advantages. In some embodiments, an SRAM device having the features described herein may reliably operate at clock frequencies as high as 5 to 6 GHz. For example, when fabricated in a process node of 16 nm, 7 nm, or smaller, and provided with a power supply voltage greater than or equal to approximately 400 mV, between 400 and 600 mV, or greater, some embodiments may operate reliably at clock frequencies up to 5 or 6 GHz. When operated at a low power supply voltage, the power consumption of the SRAM device may be very low.

Other aspects and advantages of the invention will become apparent from the following drawings, detailed description, and claims, which illustrate the principles of the invention, by way of example only.

The foregoing Summary, including the description of some embodiments, motivations therefor, and/or advantages thereof, is intended to assist the reader in understanding the present disclosure, and does not in any way limit the scope of any of the claims. The reference numbers shown in the foregoing Summary refer to the reference numbers in the drawings, and are provided by way of example only, without limiting the scope of any of the claims in any way.

BRIEF DESCRIPTION OF THE DRAWINGS

Certain advantages of some embodiments may be understood by referring to the following description taken in conjunction with the accompanying drawings. In the drawings, like reference characters generally refer to the same parts throughout the different views. Also, the drawings are not necessarily to scale, emphasis instead generally being placed upon illustrating principles of some embodiments of the invention.

DETAILED DESCRIPTION

As used herein, a node (or terminal) of a circuit "floats" or "is floating" when the circuit is not actively driving a current onto the node or actively driving the voltage of the node. For example, a circuit's node is floating when the circuit provides no conductive path between the node and the circuit's ground node, and also provides no conductive path between the node and the circuit's power-supply node. When a node is floating, any charge on the node will generally not discharge to ground through the circuit, and the circuit will generally not deposit additional charge on the node. One of ordinary skill in the art will understand that when a node is floating, the node can be charged or discharged through leakage currents in the circuit, through another circuit coupled to the node, through interaction with an electromagnetic field, etc. Thus, from the circuit's perspective, the voltage of the node may be indeterminate when the node is floating. However, in some embodiments, when a node is initially placed in the floating state, the node can initially retain the same voltage that was present at the node immediately prior to the node entering the floating state.

As used herein, "diffusion terminals" of a device (e.g., FET) may include the source and drain terminals of the device, irrespective of how the device and/or the terminals are fabricated. The source and drain terminals may be coupled, respectively, to the source and drain regions of the FET.

In an integrated circuit ("IC" or "chip"), signals may be transmitted between devices using conductive "lines." As used herein, a "line" may include any electrically conductive wire, trace, via, or other suitable structure operable to propagate a signal from one device to another.

As used herein, a memory "word" is a set of memory cells (e.g., SRAM cells) that can be read or written in parallel. In some implementations, the cells of an SRAM device having M address lines and N data lines may be organized in an array of $2^M$ words of N bits each.

The voltage of a signal (or node) can, in some cases, represent a bit value of 1 ("logic-1" or "L1") or a bit value of 0 ("logic-0" or L0). L1 can correspond to a power-supply voltage (e.g., 1.2 V, 0.6 V, 0.4 V, etc.) of a circuit, and L0 can correspond to a reference or ground voltage (e.g., 0 V) of circuit. Other voltage values for L1 and L0 are possible. For example, L1 can correspond to any voltage above a first predetermined voltage threshold (e.g., 80% of the actual or nominal power-supply voltage), and L0 can correspond to any voltage below a second predetermined voltage threshold (e.g., the nominal or actual reference voltage plus 20% of the difference between the power-supply voltage and the reference voltage). The logical value of a signal can be indeterminate if the voltage of the signal is between the first and second predetermined voltages.

Figure 1:
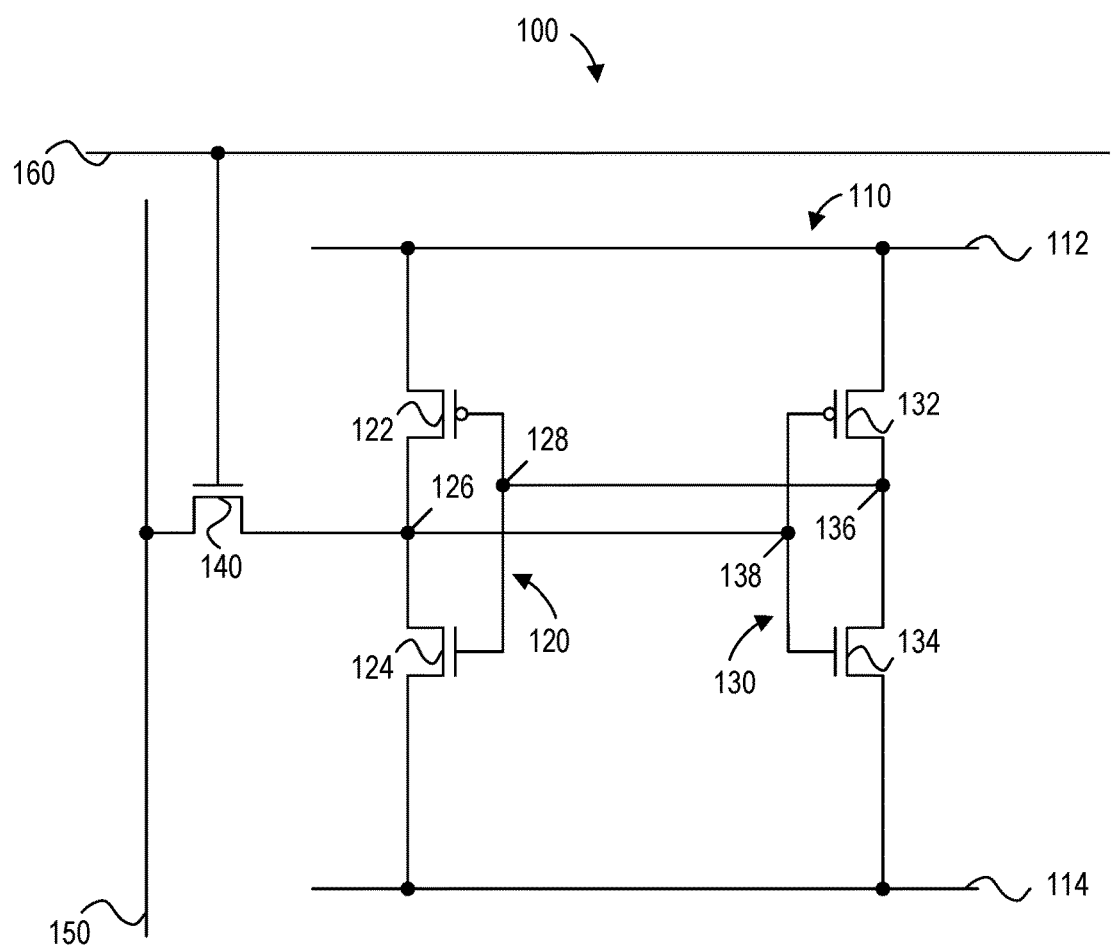
FIG. 1 is a schematic of a five-transistor (5T) SRAM cell.
Figure 2A:
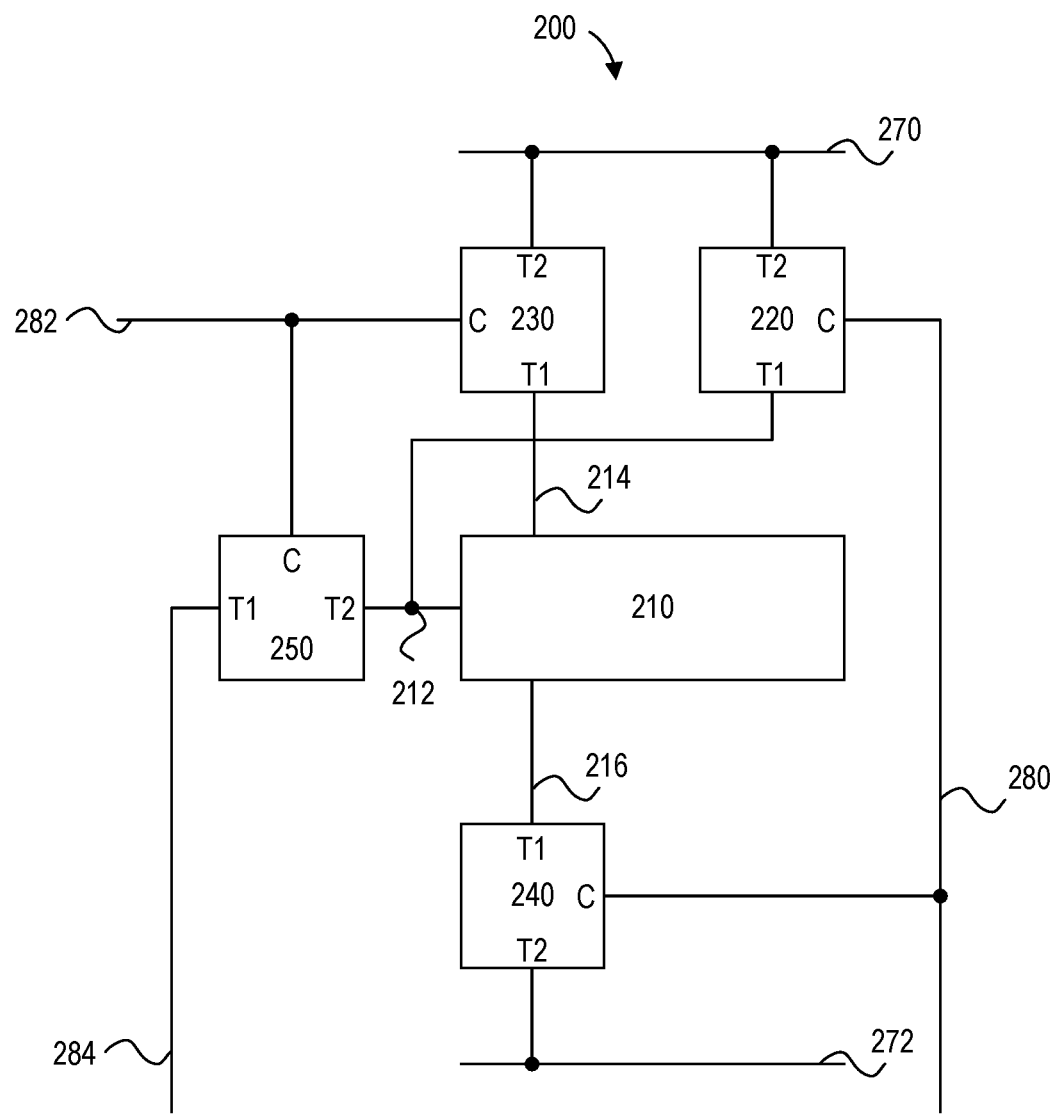
FIG. 2A is a block diagram of an SRAM cell, in accordance with some embodiments.

Referring to FIG. 2A, an SRAM cell 200 includes a latch 210, pulling devices 220, 230, and 240, and an access device 250. The latch 210 is operable to store a bit B at a node 212. As shown in FIG. 2A, the node 212 is coupled to a power-supply rail 270 via the pulling device 220, which may be operable to selectively pull the voltage of the node 212 toward the voltage of a power-supply rail 270. Furthermore, a terminal 214 of the latch 210 is coupled to the power-supply rail 270 via the pulling device 230, and a terminal 216 of the latch is coupled to another power-supply rail 272 via the pulling device 240. The latch 210 may be operable to selectively pull the potential of the node 212 toward the voltage of the power-supply rail 270 when the pulling device 230 is activated (coupling the terminal 214 to the power-supply rail 270), and to selectively pull the potential of the node 212 toward the voltage of the power-supply rail 272 when the pulling device 240 is activated (coupling the terminal 216 to the power-supply rail 272). The access device 250 may be operable to provide read/write access to the bit B of the SRAM cell.

Each of the pulling devices (220, 230, 240) may be operable to pull the voltage $V_{N1}$ of a node N1 toward the voltage $V_{N2}$ of another node N2 by conductively coupling node N1 to node N2 such that the voltage of node N1 increases (is "pulled up") or decreases (is "pulled down") from its initial value $V_1$ (prior to the conductive coupling) to a new value $V_F$, such that the magnitude of the difference between $V_F$ and $V_{N2}$ is less than the magnitude of the difference between $V_1$ and $V_{N2}$. Pulling the voltage of a node N1 "toward" the voltage of another node N2 may include pulling the voltage of N1 "to" the voltage of N2. A pulling device may pull the voltage V of a node N1 to the voltage $V_{N2}$ of a node N2 by conductively coupling the nodes such that the voltage of node N1 increases or decreases from its initial value $V_1$ to a new value that matches the voltage $V_{N2}$ of node N2, or to a new value that differs from $V_{N2}$ by less than a predetermined percentage of the nominal power-supply voltage (e.g., 1%, 5%, 10%, 20%, 40%) or by less than a predetermined amount (e.g., 20 mV, 50 mV, 100 mV, 200 mV, 500 mV, 1 V).

Each of the pulling devices (220, 230, 240) may be a pull-up device or pull-down device. A pull-up device may be operable to pull up the voltage of a node coupled to a terminal T1 of the pull-up device toward the voltage of another node (e.g., a power-supply rail) coupled to a terminal T2 of the pull-up device. A pull-up device may include one or more switches (e.g., p-channel MOSFETs (pFETs)), one or more resistive devices (e.g., resistors), any other circuit components suitable for performing a pull-up operation, or any combination thereof.

A pull-down device may be operable to pull down the voltage of a node coupled to a terminal T1 of the pull-down device toward the voltage of another node (e.g., a power-supply rail) coupled to a terminal T2 of the pull-down device. A pull-down device may include one or more switches (e.g., n-channel MOSFETs (nFETs)), one or more resistive devices (e.g., resistors), any other circuit components suitable for performing a pull-down operation, or any combination thereof.

As discussed above, the latch 210 is operable to store a bit B at the node 212. The latch 210 may include any circuitry (e.g., bistable circuitry) suitable for storing a bit value including, without limitation, two cross-coupled inverters, any even number of inverters coupled serially in a loop, a set-reset (SR) latch, a gated SR latch, a D latch, a gated D latch, an Earle latch, or any combination thereof.

As discussed above, the access device 250 is operable to provide read and/or write access to the bit B of the SRAM cell. The access device 250 may include any circuitry suitable for providing read and/or write access to the SRAM cell including, without limitation, one or more switches (e.g., pFETs or nFETs), one or more transmission gates (e.g., a pFET and an nFET having their respective diffusion terminals coupled together, and their gates coupled to complementary control signals), or any combination thereof.

Referring again to FIG. 2A, the activation and deactivation of each pulling device (220, 230, 240) may be controlled by a respective control signal provided at the pulling device's control terminal C. For example, the activation and deactivation of the pulling devices 220 and 240 may be controlled by a control signal provided on a control line ("CL") 280. When the pulling device 220 is activated, the node 212 may be coupled to the power-supply rail 270. When the pulling device 240 is activated, the terminal 216 of the latch 210 may be coupled to the power-supply rail 272. In some embodiments, the pulling device 220 is active ("on") only if the control signal provided to control terminal C of the pulling device 220 by the control line 280 has a particular logical value L (e.g., L0 or L1). In some embodiments, the pulling device 240 is active only if the control signal provided to control terminal C of the pulling device 240 by the control line 280 has the logical value that is the opposite of L (e.g., L1 or L0). Thus, in general, the pulling devices 220 and 240 may not be active at the same time.

The activation and deactivation of the pulling device 230 and the access device 250 may be controlled by a selection signal provided on a word line ("WL") 282. When the pulling device 230 is activated, the terminal 214 of the latch 210 may be coupled to the power-supply rail 270. When the access device 250 is activated, the node 212 storing the bit B may be coupled to a bit line ("BL") 284. The bit line 284 and the access device 250 may be used to read the value of the bit B out of the SRAM cell 200, and/or to write a new bit value into the SRAM cell 200. In some embodiments, the pulling device 230 is active only if the selection signal provided to the control terminal C of the pulling device 230 by the word line 282 has a particular logical value L (e.g., L0 or L1), and the access device 250 is active only if the selection signal provided to the control terminal C of the access device 250 by the word line 282 has the opposite logical value (e.g., L1 or L0). Thus, in general, the pull-up device 230 and the access device 250 may not be active at the same time.

Based on the signals applied to the control line 280, the word line 282, and the bit line 284, the SRAM cell 200 may operate in an idle state, a read state, or a write state. In the idle state, the bit value at the node 212 is neither read nor written, and is stably maintained by the latch 210. The SRAM cell 200 may be placed in the idle state, for example, by deactivating the access device 250 and the pulling device 220, and by activating the pulling devices 230 and 240. Deactivating the access device 250 and the pulling device 220 decouples the node 212 from the bit line 284 and eliminates all conductive paths between the node 212 and the supply rails (270, 272) other than paths through the latch 210, such that the bit value stored by the latch 210 does not change while the SRAM cell 200 is in the idle state. Activating the pulling devices 230 and 240 allows the latch 210 to selectively pull the voltage of the node 212 toward the voltage of either of the power-supply rails (270, 272), as appropriate, thereby maintaining the cell's bit value. In some embodiments, the SRAM cell 200 is placed in the idle state by providing (1) a signal that activates the pulling device 230 and deactivates the access device 250 on the word line 282, and (2) a signal that activates the pulling device 240 and deactivates the pulling device 220 on the control line 280.

In the read state, the bit value at the node 212 is read out via the bit line 284. The SRAM cell 200 may be placed in the read state, for example, by activating the pulling device 240, deactivating the pulling devices 220 and 230, initializing the voltage of the bit line 284, placing the initialized bit line 284 in the floating state, and activating the access device 250. Deactivating the pulling devices 220 and 230 (and floating the bit line 284) eliminates all conductive paths between the node 212 and the supply rail 270, such that the node 212 is not coupled to the supply rail 270 during the read operation. By contrast, activating the pulling device 240 allows the latch 210 to selectively couple the node 212 to the power-supply rail 272 during the read operation.

The voltage of the bit line 284 may be initialized to a suitable value before activating the access device 250. In some embodiments, the initial voltage of the bit line 284 is suitable for a read operation if coupling the initialized, floating bit line 284 to the node 212 via the access device 250 (1) does not change the SRAM cell's bit value (e.g., does not change the voltage of the node 212 so much as to flip the cell's bit value), and (2) reads out the SRAM cell's bit value onto the bit line 284 (e.g., sets the voltage of the bit line 284 to a value that represents the SRAM cell's bit value). For example, the voltage of the bit line 284 may be initialized to (1) the voltage of the supply rail 270, (2) any voltage that represents the same bit value as the supply rail 270, or (3) a voltage that lies outside the range of voltages associated with the bit value represented by the supply rail 270 by less than a predetermined margin.

Depending on the bit value of the node 212, two scenarios are possible during a read operation. In the first scenario, the bit value of the node 212 matches the bit value of the supply rail 270, and the voltage ($V_{CELL}$) at the node 212 is approximately equal to the voltage ($V_{270}$) at the supply rail 270. In this scenario, the node 212 is floating during the read operation, because the pulling device 230 is inactive (preventing the latch 210 from pulling the voltage of the node 212 toward the voltage of the supply rail 270), and the latch is not pulling the voltage of the node 212 toward the voltage of the supply rail 272. Thus, when the access device 250 is activated, the voltage on the bit line 284 ($V_{BL}$) and the voltage ($V_{CELL}$) at the node 212 begin to equalize. If $V_{BL}$ was approximately equal to the voltage of the supply rail 270 ($V_{270}$) prior to activating the access device 250, then $V_{BL}$ and $V_{CELL}$ remain approximately equal to $V_{270}$ after activation of the access device, thereby reading the cell's bit value onto the bit line 284 without disturbing the cell's bit value. Alternatively, if $V_{BL}$ was less than $V_{270}$ prior to activating the access device 250, then $V_{BL}$ increases and $V_{CELL}$ decreases after activation of the access device, such that $V_{BL}$ and $V_{CELL}$ are both within the range of voltages associated with the bit value of the supply rail 270 at the end of the read operation.

In the second scenario, the bit value of the node 212 matches the bit value of the supply rail 272, and the voltage ($V_{CELL}$) at the node 212 is approximately equal to the voltage ($V_{272}$) at the supply rail 272. In this scenario, the node 212 is not floating during the read operation, because the latch 210 is pulling the voltage of the node 212 toward the voltage of the supply rail 272. Thus, when the access device 250 is activated, the latch pulls the voltage of the bit line 284 toward the voltage of the supply rail 272 as well. Thus, irrespective of whether $V_{BL}$ was less than or equal to the voltage of the supply rail 270 ($V_{270}$) prior to activation of the access device, $V_{BL}$ decreases after activation of the access device, such that $V_{BL}$ and $V_{CELL}$ are both within the range of voltages associated with the bit value of the supply rail 272 at the end of the read operation.

In some embodiments, the SRAM cell 200 is placed in the read state by providing (1) a signal on the word line 282 that deactivates the pulling device 230 and activates the access device 250, and (2) a signal on the control line 280 that activates the pulling device 240 and deactivates the pulling device 220. To avoid disturbing the stored bit value of the SRAM cell, the value of the bit line 284 may be initialized and the bit line may be placed in the floating state before activating the access device 250.

In the write state, a new bit value B2 is written to the node 212 via the bit line 284. The write state may include two successive stages. In the first stage, the node 212 may be decoupled from the power-supply rail 272 and the bit line 284 by deactivating the pulling device 240 and the access device 250. Using the pulling device 220, the voltage of the node 212 may be pulled toward the voltage of the power-supply rail 270, thereby storing the bit value B1 that corresponds to the voltage of the power-supply rail 270 at the node 212. In this manner, the SRAM cell 200 may reduce or eliminate contention between pulling devices of different types (e.g., pull-up and pull-down devices) at the node 212 during the first stage of the write operation.

In the second stage of the write operation, the node 212 may be decoupled from the power-supply rail 270 by deactivating the pulling devices 220 and 230, and coupled to the bit line 284 via the access device 250. If the bit value B2 on the bit line 284 differs from the bit value B1 that was written to the cell during the first stage of the write operation, the value on the bit line overrides the value at the node 212, and the latch 210 pulls the voltage of the node 212 toward the voltage of the power-supply rail 272 (which corresponds to the bit value B2) via the pulling device 240. Otherwise, all the pulling devices in the cell are inactive during the second stage of the write operation, and the node 212 continues to store the bit value B1. In this manner, the SRAM cell 200 may reduce or eliminate contention between pulling devices of different types (e.g., pull-up and pull-down devices) at node 212 during the second stage of the write operation.

In some embodiments, the SRAM cell 200 is placed in the first stage of the write state by providing (1) a signal on the word line 282 that activates the pulling device 230 and deactivates the access device 250, and (2) a signal on the control line 280 that deactivates the pulling device 240 and activates the pulling device 220. In some embodiments, the SRAM cell 200 is placed in the second stage of the write state by (1) providing a signal on the word line 282 that deactivates the pulling device 230 and activates the access device 250, (2) providing a signal on the control line 280 that activates the pulling device 240 and deactivates the pulling device 220, and (3) driving the bit value B2 to be written to the SRAM cell on the bit line 284.

Figure 2B:
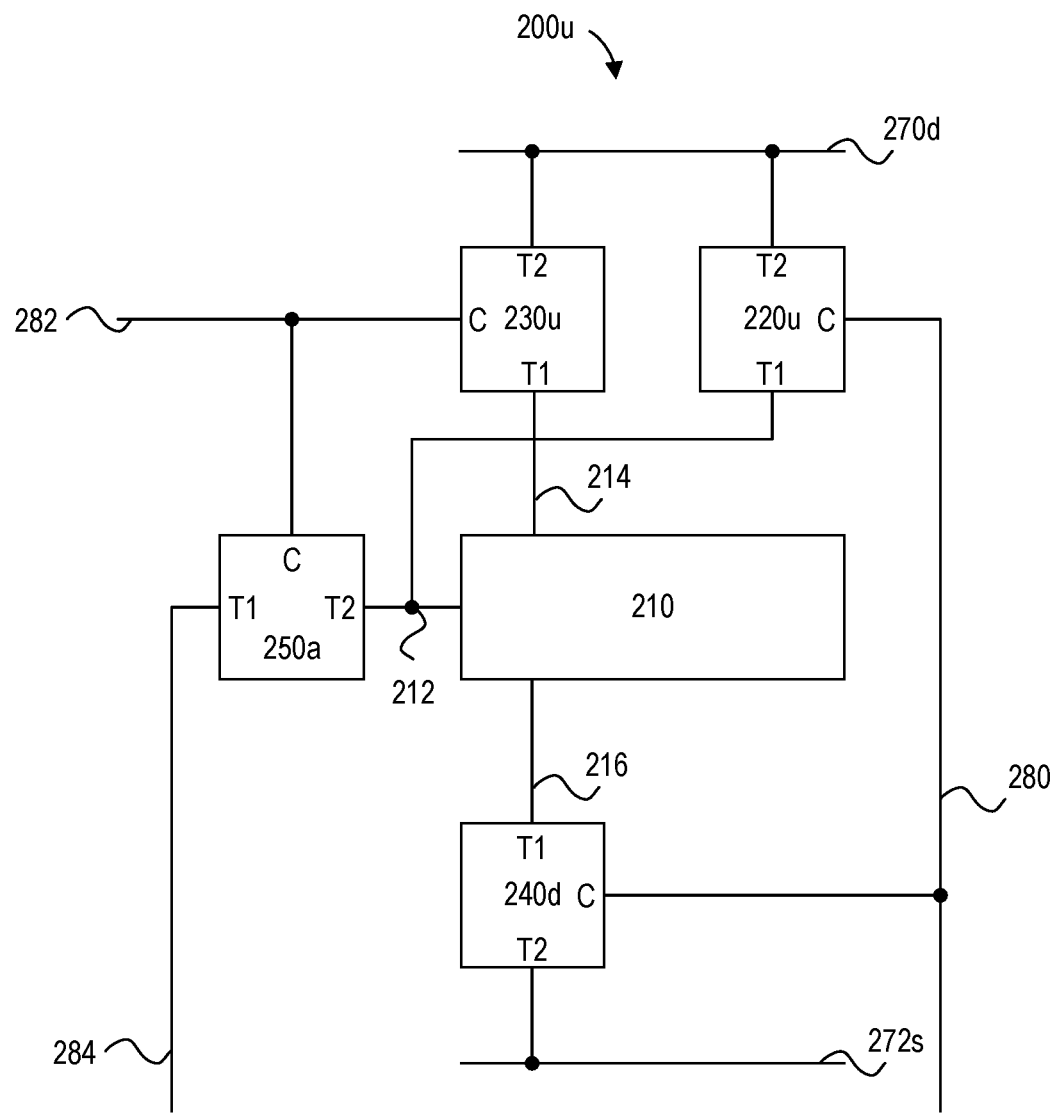
FIG. 2B is a block diagram of an embodiment of the SRAM cell of FIG. 2A.

Referring to FIG. 2B, the SRAM cell 200 of FIG. 2A may be implemented as an SRAM cell 200u. In some embodiments, the SRAM cell 200u can perform a two-stage write operation in which the bit value of node 212 is set to L1 (pulled up toward the voltage Vdd of the power-supply rail 270d) during the first stage. In the second stage, the bit value of node 212 remains L1 if the value being written to the cell is L1, or switches to L0 (is pulled down toward the voltage Vss of the power-supply rail 272s) if the value being written to the cell is L0. For ease of reference, the power-supply rail 270d may be referred to herein as the "supply rail" 270d, and the power-supply rail 272s may be referred to herein as the "ground rail" 272s.

The SRAM cell 200u includes a latch 210, pull-up devices 220u and 230u, a pull-down device 240d, and an access device 250a. The latch 210 stores a bit B at a node 212. The node 212 is coupled to the supply rail 270d via the pull-up device 220u. A terminal 214 of the latch 210 is coupled to the supply rail 270d via the pull-up device 230u, and a terminal 216 of the latch 210 is coupled to the ground rail 272s via the pull-down device 240d. The latch 210 can selectively pull up the potential of the node 212 toward Vdd when the pull-up device 230u is activated (coupling the terminal 214 to the supply rail 270d), and can selectively pull down the potential of the node 212 toward Vss when the pull-down device 240d is activated (coupling the terminal 216 to the ground rail 272s). The access device 250a provides read/write access to the bit B of the SRAM cell.

Some embodiments of the latch 210, the access device 250a, and the pulling devices (220u, 230u, 240d) of FIG. 2B are described above with reference, respectively, to the latch 210, the access device 250, and the pulling devices (220, 230, and 240) of FIG. 2A. For brevity, the descriptions of these devices are not repeated here. In some embodiments, each of the pull-up devices 220u and 230u is active when the bit value L0 is provided at the device's control terminal C. In some embodiments, the pull-down device 240d and the access device 250a are each active when the bit value L1 is provided at the device's control terminal C.

Based on the signals applied to the control line 280, the word line 282, and the bit line 284, the SRAM cell 200u may operate in an idle state, a read state, or a write state. In the idle state, the bit value at the node 212 is neither read nor written, and is stably maintained by the latch 210. In some embodiments, the SRAM cell 200u is placed in the idle state by (1) providing the bit value L0 on the word line 282, thereby activating the pull-up device 230u and deactivating the access device 250a, and (2) providing the bit value L1 on the control line 280, thereby activating the pull-down device 240d and deactivating the pull-up device 220u.

In the read state, the bit value at the node 212 is read out via the bit line 284. The SRAM cell 200u may be placed in the read state, for example, by activating the pull-down device 240d, deactivating the pull-up devices 220u and 230u, initializing the voltage of the bit line 284, placing the initialized bit line 284 in the floating state, and activating the access device 250a. The voltage of the bit line 284 may be initialized to a suitable value before activating the access device 250a. In some embodiments, the initial voltage of the bit line 284 is (1) the voltage Vdd of the supply rail 270d, (2) any voltage within a range of voltages that represents the bit value (L1) represented by the voltage Vdd of the supply rail 270d, or (3) a voltage that lies outside the range of voltages associated with the bit value L1 by less than a predetermined margin.

Depending on the bit value of the node 212, two scenarios are possible during a read operation. In the first scenario, the bit value of the node 212 is L1. In this scenario, the node 212 floats during the read operation. Thus, when the access device 250a is activated, the voltage on the bit line 284 ($V_{BL}$) and the voltage ($V_{CELL}$) at the node 212 begin to equalize, such that $V_{BL}$ and $V_{CELL}$ are both within the range of voltages associated with the bit value L1 at the end of the read operation. In the second scenario, the bit value of the node 212 is L0. In this scenario, the latch 210 pulls down the voltage of the node 212 toward the voltage Vss of the ground rail 272s. Thus, when the access device 250a is activated, the latch pulls down the voltage of the bit line 284 toward the voltage of the ground rail 272s as well, such that $V_{BL}$ and $V_{CELL}$ are both within the range of voltages associated with the bit value L0 at the end of the read operation.

In some embodiments, the SRAM cell 200u is placed in the read state by providing the bit value L1 on the word line 282 and on the control line 280. The value of the bit line 284 may be initialized and the bit line may be placed in the floating state before providing the bit value L1 on the word line 282, to avoid disturbing the stored bit value of the SRAM cell.

In the write state, a new bit value is written to the node 212 via the bit line 284. The write state may include two successive stages. In the first stage, the node 212 may be decoupled from the ground rail 272s and the bit line 284 by deactivating the pull-down device 240d and the access device 250a, and the voltage of the node 212 may be pulled up toward the voltage Vdd of the supply rail 270d via the pull-up device 220u, thereby setting the bit value of the node 212 to L1.

In the second stage, the node 212 may be decoupled from the supply rail 270d by deactivating the pull-up devices 220u and 230u, and coupled to the bit line 284 via the access device 250a. If the bit value on the bit line 284 is L0, the L0 value on the bit line overrides the L1 value at the node 212, and the latch 210 pulls the voltage of the node 212 toward the voltage of the ground rail 272s via the pull-down device 240d. Otherwise, all the pulling devices in the cell are inactive during the second stage of the write operation, and the node 212 continues to store the bit value L1.

In some embodiments, the SRAM cell 200u is placed in the first stage of the write state by providing the bit value L0 on the word line 282 and on the control line 280. In some embodiments, the SRAM cell 200 is placed in the second stage of the write state by providing the bit value L1 on the word line 282 and on the control line 280, while also driving the bit value B to be written to the SRAM cell on the bit line 284.

Figure 2C:
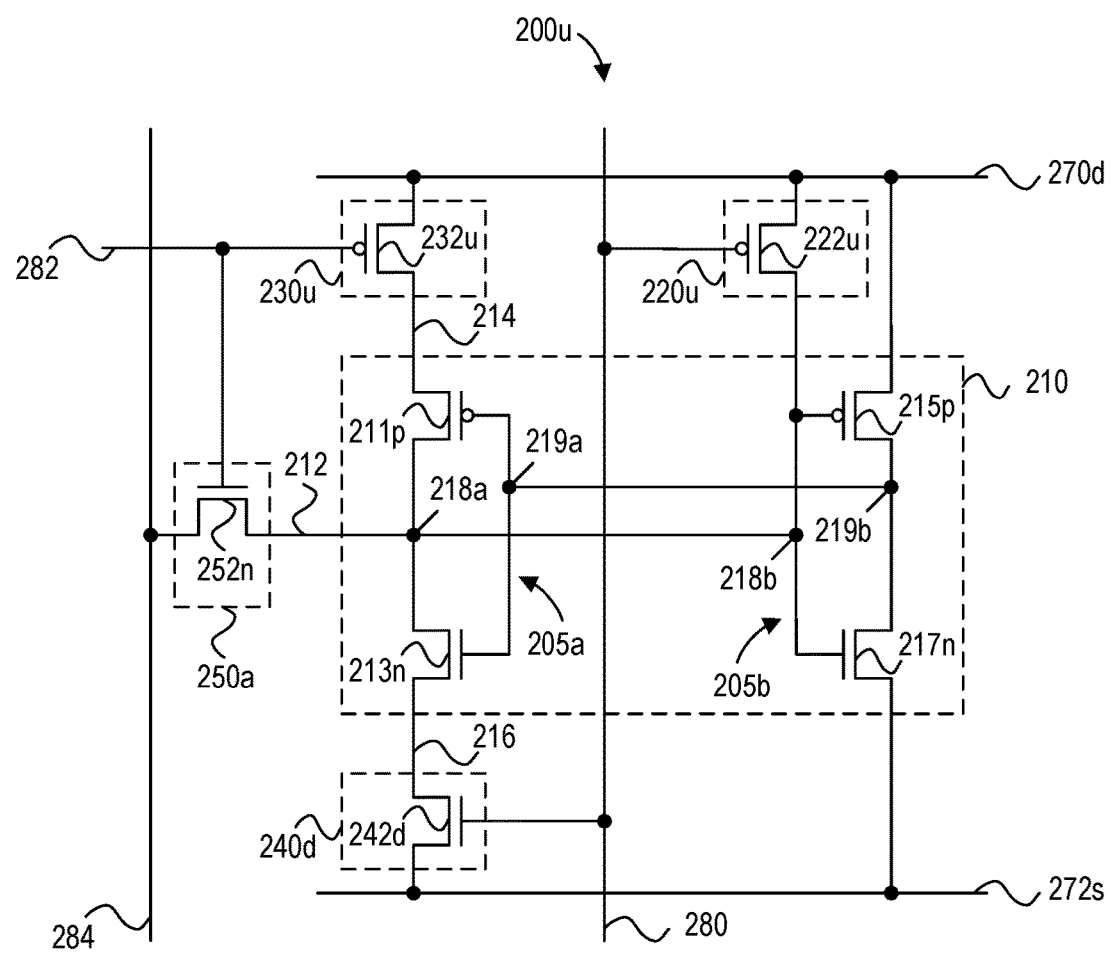
FIG. 2C is a schematic of the SRAM cell of FIG. 2B, in accordance with some embodiments.

Referring to FIG. 2C, in an embodiment of the SRAM cell 200u, the latch 210 may be implemented using cross-coupled CMOS inverters 205a and 205b, the pull-up devices 220u and 230u may be implemented using p-channel MOSFETs (pFETs) 222u and 232u, respectively, the pull-down device 240d may be implemented using an n-channel MOSFET (nFET) 242d, and the access device 250a may be implemented using an nFET 252n. The arrangement of devices in FIG. 2C is described in further detail below.

In the example of FIG. 2C, the latch 210 is implemented using cross-coupled inverters 205a and 205b. The output 218a of the inverter 205a is coupled to the input 218b of the inverter 205b, and the output 219b of the inverter 205b is coupled to the input 219a of the inverter 205a. Other implementations of the latch 210 are possible.

The inverter 205a includes a pFET 211p and an nFET 213n. The gates of the pFET 211p and the nFET 213n are coupled together to form the input 219a of the inverter 205a. Diffusion terminals (e.g., drains) of the pFET 211p and the nFET 213n are coupled together to form the output 218a of the inverter 205a, which is also the node 212 where the bit value B of the SRAM cell 200u is stored. The other diffusion terminals (e.g., sources) of the pFET 211p and the nFET 213n are coupled, respectively, to terminals 214 and 216 of the latch 210.

Likewise, the inverter 205b includes a pFET 215p and an nFET 217n. The gates of the pFET 215p and the nFET 217n are coupled together to form the input 218b of the inverter 205b. Diffusion terminals (e.g., drains) of the pFET 215p and the nFET 217n are coupled together to form the output 219b of the inverter 205b, which is also the node where the inverse B' of the bit value B of the SRAM cell 200u is stored. The other diffusion terminals (e.g., sources) of the pFET 215p and the nFET 217n are coupled, respectively, to the supply rail 270d and the ground rail 272s.

In the example of FIG. 2C, the pull-up device 220u is implemented using a pFET 222u. In particular, one diffusion terminal (e.g., drain) of the pFET 222u is coupled to the node 212, and the other diffusion terminal (e.g., source) of the pFET 222u is coupled to the supply rail 270d. The gate of the pFET 222u is coupled to the control line 280, such that the pFET 222u is on when the control line 280 provides the bit value L0. Other implementations of the pull-up device 220u are possible. In some embodiments, the pull-up device 220u includes a stack of two or more pFETs with their diffusion terminals coupled in series between the node 212 and the supply rail 270d, and with their gates coupled to the control line 280.

In the example of FIG. 2C, the pull-up device 230u is implemented using a pFET 232u. In particular, one diffusion terminal (e.g., drain) of the pFET 232u is coupled to the latch terminal 214, and the other diffusion terminal (e.g., source) of the pFET 232u is coupled to the supply rail 270d. The gate of the pFET 232u is coupled to the word line 282, such that the pFET 232u is on when the word line 282 provides the bit value L0. Other implementations of the pull-up device 230u are possible. In some embodiments, the pull-up device 230u includes a stack of two or more pFETs with their diffusion terminals coupled in series between the latch terminal 214 and the supply rail 270d, and with their gates coupled to the word line 282.

In the example of FIG. 2C, the pull-down device 240d is implemented using an nFET 242d. In particular, one diffusion terminal (e.g., drain) of the nFET 242d is coupled to the latch terminal 216, and the other diffusion terminal (e.g., source) of the nFET 242d is coupled to the ground rail 272s. The gate of the nFET 242d is coupled to the control line 280, such that the nFET 242d is on when the control line 280 provides the bit value L1. Other implementations of the pull-down device 240d are possible. In some embodiments, the pull-down device 240d includes a stack of two or more nFETs with their diffusion terminals coupled in series between the latch terminal 216 and the ground rail 272s, and with their gates coupled to the control line 280.

In the example of FIG. 2C, the access device 250a is implemented using an nFET 252n. In particular, the diffusion terminals of the nFET 252n are coupled, respectively, to the bit line 284 and the node 212 of the SRAM cell. The gate of the nFET 252n is coupled to the word line 282, such that the nFET 252n is on when the word line 282 provides the bit value L1. Other implementations of the access device 250a are possible. In some embodiments, the access device 250a is implemented using a transmission gate, with the control gate of the transmission gate's nFET coupled to the word line 282, the control gate of the transmission gate's pFET coupled to receive the inverse of the signal provided on the word line 282, and the switch terminals of the transmission gate coupled, respectively, to the bit line 284 and the node 212.

Figure 3A:
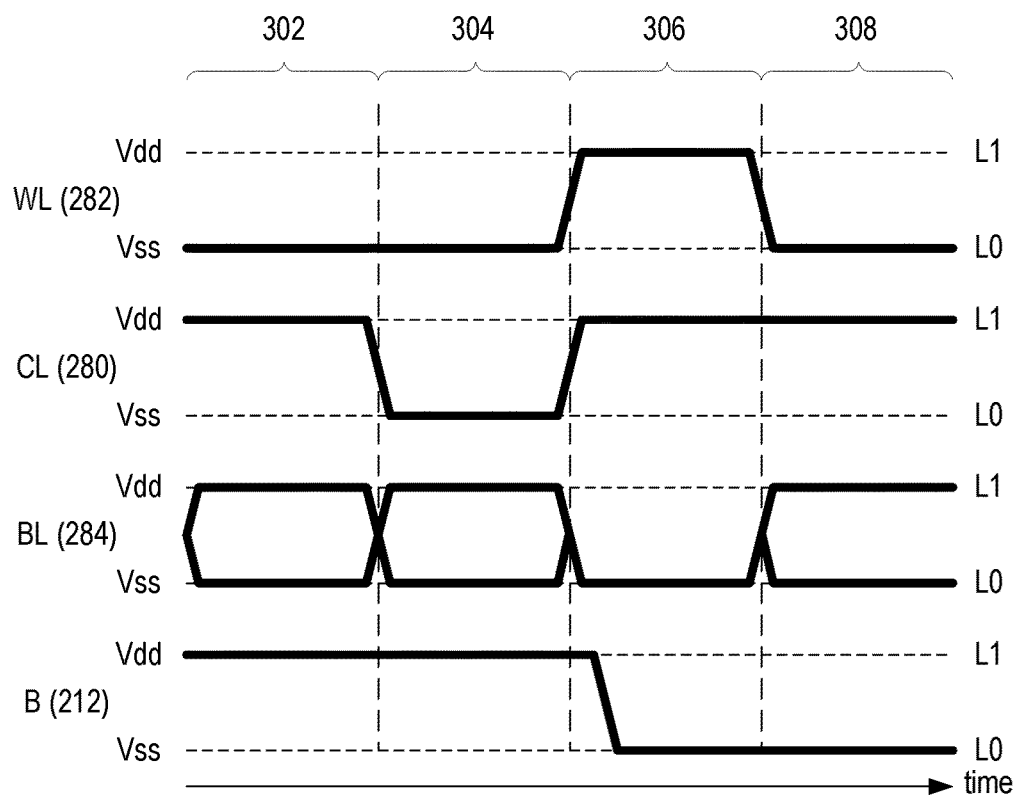
FIG. 3A is a timing diagram of an operation of writing a logic-0 value into the SRAM cell of FIGS. 2B and 2C, in accordance with some embodiments.

FIG. 3A shows a timing diagram of a write operation performed using the SRAM cell 200u, whereby the bit value L0 is written to the SRAM cell. In the example of FIG. 3A, four time periods 302, 304, 306, and 308 are illustrated. The second time period 304 and the third time period 306 correspond to the first and second stages of the write operation, respectively. The first time period 302 occurs prior to (e.g., immediately prior to) the first stage of the write operation, and the fourth time period 308 occurs after (e.g., immediately after) the second stage of the write operation.

During the first time period 302, the bit value ("B") stored in the SRAM cell 200u at node 212 is L1, the bit value of the word line ("WL") 282 is L0, the bit value of the control line 280 ("CL") is L1, and the SRAM cell 200u is in the idle state. Referring to FIG. 2B, the pull-up device 230u is on, the pull-up device 220u is off, and the latch 210 is pulling up the node 212 to the supply rail 270d via the pull-up device 230u. In the example of FIG. 2C, pFET 232u is on, pFET 222u is off, the inverter 205a of the latch 210 is outputting L1, and the inverter 205b of the latch 210 is outputting L0. In particular, since the bit value of node 212 is L1, the value at the input 218b of the inverter 205b is also L1, nFET 217n is on, pFET 215p is off, and the value at the output 219b of the inverter 205b is L0. Thus, the value at node 219a is also L0, so nFET 213n is off and pFET 211p is on. The pull-up stack (pFETs 211p and 232u) is therefore pulling up the voltage of the node 212 to the voltage Vdd of the supply rail 270d, and the pull-down stack (nFETs 213n and 242d) is off In addition, the access device 250a is off (nFET 252n is off), so the bit line 284 is decoupled from the node 212, and the value on the bit line 284 can be L0 or L1.

During the second time period 304 (the first stage of the write operation in FIG. 3A), a bit value of L1 is stored at node 212 of the SRAM cell 200u. To reduce or eliminate contention between pull-up and pull-down devices during the first stage of the write operation, the word line 282 and the control line 280 are both set to L0. Thus, referring to FIGS. 2B and 2C, the pull-up device 220u (pFET 222u) is on, the pull-up device 230u (pFET 232u) is on, and the pull-down device 240d (nFET 242d) is off. As a result, the node 212 is coupled to the supply rail 270d, and the bit value B of node 212 is therefore pulled up to L1. In particular, the value at the input 218*b* of the inverter 205*b* remains L1, the value at the output 219*b* of the inverter 205*b* remains L0, the nFET 213*n* remains off, and the pFET 211*p* remains on. Thus, pFET 222*u* and pFET stack 211*p*/232*u* pull up the voltage of the node 212 to Vdd, and the pull-down stack (nFETs 213*n* and 242*d*) is off. The access device 250*a* (nFET 252*n*) remains off, so the bit line 284 remains decoupled from the node 212.

During the third time period 306 (the second stage of the write operation in FIG. 3A), the bit value L0 is written to the SRAM cell 200*u*. To reduce or eliminate contention between pull-up and pull-down devices during the second stage of the write operation, the word line 282 and the control line 280 are both set to L1. Thus, referring to FIGS. 2B and 2C, the pull-up device 220*u* (pFET 222*u*) is off, the pull-up device 230*u* (pFET 232*u*) is off, and the pull-down device 240*d* (nFET 242*d*) is on. The latch 210 is therefore able to selectively pull down (but not pull up) the voltage of node 212.

In addition, the access device 250*a* (nFET 252*n*) is on, so the bit line 284 is coupled to the node 212, and the bit value (L0) being written to the cell is driven to the node 212 via the bit line 284. Referring to FIG. 2B, at least a portion of the charge stored at the node 212 therefore discharges via the bit line 284. After the voltage of the node 212 falls below a predetermined value, some embodiments of the latch 210 permit a portion of the charge at node 212 to discharge via the pull-down device 240*d*. In the example of FIG. 2C, when the voltage of the node 212 falls to a value corresponding to bit value L0, the output 219*b* of the inverter 205*b* switches to L1, thereby activating nFET 213*n*, and the voltage of the node 212 is pulled down to the voltage Vss of the ground rail 272*s* via the nFETs 213*n* and 242*d*. In this manner, the bit value B stored at the node 212 changes to L0.

During the fourth time period 308, the bit value B stored in the SRAM cell 200*u* at node 212 is L0, the value of the word line 282 is L0, the value of the control line 280 is L1, and the SRAM cell 200*u* is in the idle state. Referring to FIG. 2B, the pull-up device 220*u* is off, the pull-down device 240*d* is on, and the latch 210 is pulling down the node 212 to the ground rail 272*s*. In the example of FIG. 2C, pFET 222*u* is off, nFET 242*d* is on, the inverter 205*a* of the latch 210 is outputting L0, and the inverter 205*b* of the latch 210 is outputting L1. In particular, since the bit value of node 212 is L0, the value at the input 218*b* of the inverter 205*b* is also L0, nFET 217*n* is off, pFET 215*p* is on, and the value at the output 219*b* of the inverter 205*b* is L1. Thus, the value at node 219*a* is also L1, so nFET 213*n* is on and pFET 211*p* is off. The pull-down stack (nFETs 213*n* and 242*d*) is therefore pulling down the voltage of the node 212 to the voltage Vss of the ground rail 272*s*, and the pull-up stack (pFETs 211*p* and 232*u*) is off. In addition, the access device 250*a* (nFET 252*n*) is off, so the bit line 284 is decoupled from the node 212.

Thus, using the combination and sequence of input signals shown in time periods 304 and 306 of the timing diagram of FIG. 3A, the value L0 may be written into the SRAM cell 200*u* without experiencing contention between pull-up devices and pull-down devices at the node 212 that stores the cell's bit value.

In the example of FIG. 3A, the SRAM cell 200*u* stores the bit value L1 (in time period 302) prior to performing a write operation (in time periods 304 and 306) that overwrites the L1 value with an L0 value. The SRAM cell 200*u* is not limited in this regard. One of ordinary skill in the art will appreciate that prior to writing an L0 value to the SRAM cell 200*u*, the bit value stored by the cell can be either L0 or L1.

Figure 3B:
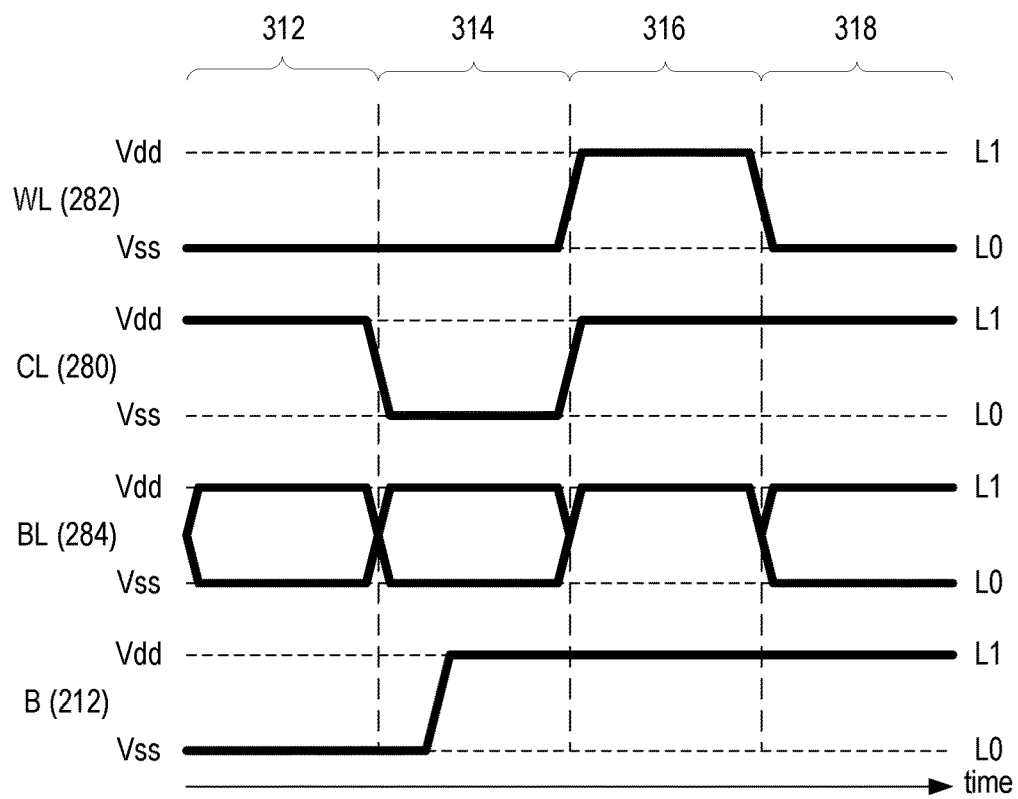
FIG. 3B is a timing diagram of an operation of writing a logic-1 value into the SRAM cell of FIGS. 2B and 2C, in accordance with some embodiments.

FIG. 3B shows a timing diagram of a write operation performed using the SRAM cell 200*u*, whereby the bit value L1 is written to the SRAM cell. In the example of FIG. 3B, four time periods 312, 314, 316, and 318 are illustrated. The second and third time periods 314 and 316 correspond to the first and second stages of the write operation, respectively. The first time period 312 occurs prior to (e.g., immediately prior to) the first stage of the write operation, and the fourth time period 318 occurs after (e.g., immediately after) the second stage of the write operation.

During the first time period 302, the bit value B stored in the SRAM cell 200*u* at node 212 is L0, the bit value of the word line (WL) 282 is L0, the bit value of the control line (CL) 280 is L1, and the SRAM cell 200*u* is in the idle state. Thus, each component of the SRAM cell 200*u* is in the same state during the time period 312 as in the time period 308.

During the second time period 314 (the first stage of the write operation in FIG. 3B), the bit value of the SRAM cell 200*u* is pulled up to L1. As in the second time period 304 in the example of FIG. 3A, the word line 282 and the control line 280 are both set to L0. Thus, referring to FIGS. 2B and 2C, the pull-up device 220*u* (pFET 222*u*) is on, the pull-up device 230*u* (pFET 232*u*) is on, and the pull-down device 240*d* (nFET 242*d*) is off. Accordingly, the node 212 is coupled to the supply rail 270*d*, and the bit value B of node 212 is pulled up toward the voltage Vdd of the supply rail 270*d*, such that the cell's bit value B changes from L0 to L1.

In particular, referring to FIG. 2B, the voltage of the node 212 is initially pulled up toward the voltage Vdd of the supply rail 270*d* by the pull-up device 220*u*. After the voltage of the node 212 rises above a predetermined value, some embodiments of the latch 210 permit the pull-up device 230*u* to assist in pulling up the voltage of the node 212. In the example of FIG. 2C, when the voltage of the node 212 rises to a value corresponding to bit value L1, the output 219*b* of the inverter 205*b* switches to L0, thereby activating pFET 213*p*, and the voltage of the node 212 is pulled up to the voltage Vdd of the supply rail 272*s* via the pFET 222*u* and the pFET stack 211*p*/232*u*. In this manner, the bit value B stored at the node 212 changes to L1. The access device 250*a* (nFET 252*n*) remains off, so the bit line 284 remains decoupled from the node 212.

During the third time period 316 (the second stage of the write operation in FIG. 3B), the bit value B of the SRAM cell 200*u* remains L1. As in the third time period 306 in the example of FIG. 3A, the word line 282 and the control line 280 are both set to L1. Thus, referring to FIGS. 2B and 2C, the pull-up device 220*u* (pFET 222*u*) is off, the pull-up device 230*u* (pFET 232*u*) is off, and the inverter 205*a* of the latch 210 is not pulling down the node 212 because the nFET 213*n* of the pull-down stack 213*n*/242*d* is off. In addition, the access device 250*a* (nFET 252*n*) is on, so the bit line 284 is coupled to the node 212, and the bit value (L1) being written to the cell is driven to the node 212 via the bit line 284.

With the pull-up devices (220*u*, 230*u*) off and the bit value L1 being driven on the bit line 284, the bit value B stored at node 212 (L1) does not change. Referring to FIG. 2B, the latch 210 is configured to maintain its bit value unless that bit value is overridden by an external device. In particular, referring to FIG. 2C, the value at the input 218*b* of the inverter 205*b* remains L1, the value at the output 219*b* of the inverter 205*b* remains L0, and the nFET 213*n* remains off. Thus, the voltage of the node 212 is not pulled down, and the bit value of the SRAM cell 200*u* remains L1.

During the fourth time period 318, the value of the selection signal on the word line 282 is L0, the value of the control signal on the control line 280 is L1, and the bit value B stored in the SRAM cell 200*u* at node 212 is L1. Thus, each component of the SRAM cell 200*u* is in the same state during the time period 318 as in the time period 302.

Thus, using the combination and sequence of input signals shown in time periods 314 and 316 of the timing diagram of FIG. 3B, the value L1 may be written into the SRAM cell 200*u* without experiencing contention between pull-up devices and pull-down devices at the node 212 that stores the bit value B of the SRAM cell.

In the example of FIG. 3B, the SRAM cell 200*u* stores the bit value L0 (in time period 312) prior to performing a write operation (in time periods 314 and 316) that overwrites the L0 value with an L1 value. The SRAM cell 200*u* is not limited in this regard. One of ordinary skill in the art will appreciate that prior to writing an L1 value to the SRAM cell 200*u*, the bit value stored by the cell can be either L0 or L1.

Figure 3C:
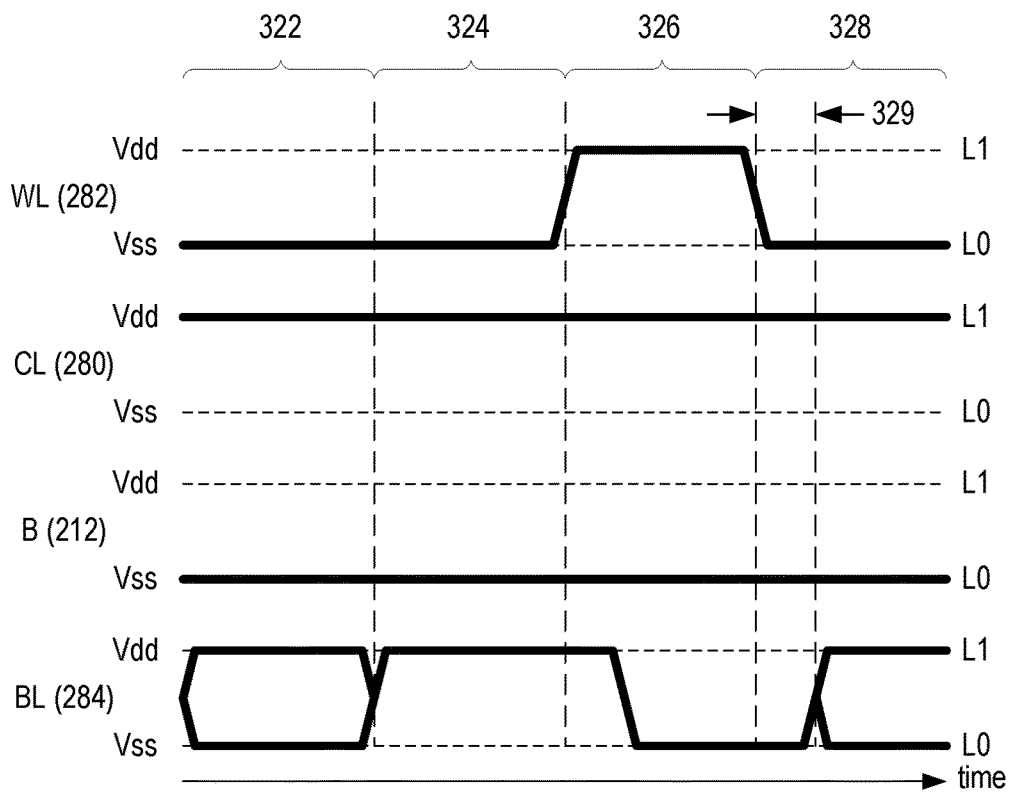
FIG. 3C is a timing diagram of an operation of reading a logic-0 value from the SRAM cell of FIGS. 2B and 2C, in accordance with some embodiments.

FIG. 3C shows a timing diagram of a read operation performed using the SRAM cell 200*u*, whereby the bit value L0 is read from the SRAM cell. In the example of FIG. 3C, four time periods 322, 324, 326, and 328 are illustrated. The second time period 324 and the third time period 326 correspond to the first and second stages of the read operation, respectively. The first time period 322 occurs prior to (e.g., immediately prior to) the first stage of the read operation, and the fourth time period 328 occurs after (e.g., immediately after) the second stage of the read operation.

During the first time period 322, the bit value ("B") stored in the SRAM cell 200*u* at node 212 is L0, the bit value of the word line ("WL") 282 is L0, and the bit value of the control line ("CL") 280 is L1. Thus, as in time periods 308 and 312 of the examples of FIGS. 3A and 3B, the pull-up device 220*u* (pFET 222*u*) is off, the pull-down device 240*d* (nFET 242*d*) is on, and the latch 210 is pulling down the node 212 to the ground rail 272*s*. In addition, the access device 250*a* (nFET 252*n*) is off, so the bit line 284 is decoupled from the node 212, and the value on the bit line 284 can be L0 or L1.

During the second time period 324 (the first stage of the read operation in FIG. 3C), the voltage of the bit line 284 is set ("pre-charged") to a predetermined value and then placed in a floating state. In the example of FIG. 3C, the bit line 284 is pre-charged to Vdd, but any other voltage suitable for reading out the bit value of the SRAM cell 200*u* may be used (e.g., Vdd, Vdd/2, any voltage that represents the bit value L1, etc.). Otherwise, the state of the SRAM cell 200*u* may remain the same from the first time period 322 to the second time period 324.

During the third time period 326 (the second stage of the read operation in FIG. 3C), the bit value B of the SRAM cell 200*u* is read out onto the bit line 284. To initiate the second stage of the read operation, the word line 282 and the control line 280 are both set to L1. Thus, referring to FIGS. 2B and 2C, the pull-up device 220*u* (pFET 222*u*) is off, the pull-up device 230*u* (pFET 232*u*) is off, and the pull-down device 240*d* (nFET 242*d*) is on. Since the bit value B stored by the latch 210 is L0, the latch 210 pulls down the voltage of the node 212 via the pull-down device 240*d*. In particular, the inverter 205*a* of the latch 210 pulls down the voltage of the node 212 via the pull-down stack of nFETs 213*n* and 242*d*. In addition, the access device 250*a* (nFET 252*n*) is on, and the bit line 284 is coupled to the node 212. As a result, the bit line 284 is also pulled down via the latch 210 and the pull-down device 240*d*, thereby discharging the pre-charged voltage of the bit line 284 and setting the value of the bit line 284 to L0.

During the fourth time period 328, the value of the selection signal on the word line 282 is L0, the value of the control signal on the control line 280 is L1, and the bit value B stored in the SRAM cell 200*u* at node 212 is L0. Thus, each component of the SRAM cell 200*u* is in the same state during the time period 328 as in the time period 322. In some embodiments, the bit value that was driven onto the bit line during the second stage of the read operation remains on the bit line for at least a pre-determined time period 329 ("hold time") after the value of the word line 282 switches to L0, to give downstream circuits adequate time to latch the value of the bit line 284.

Figure 3D:
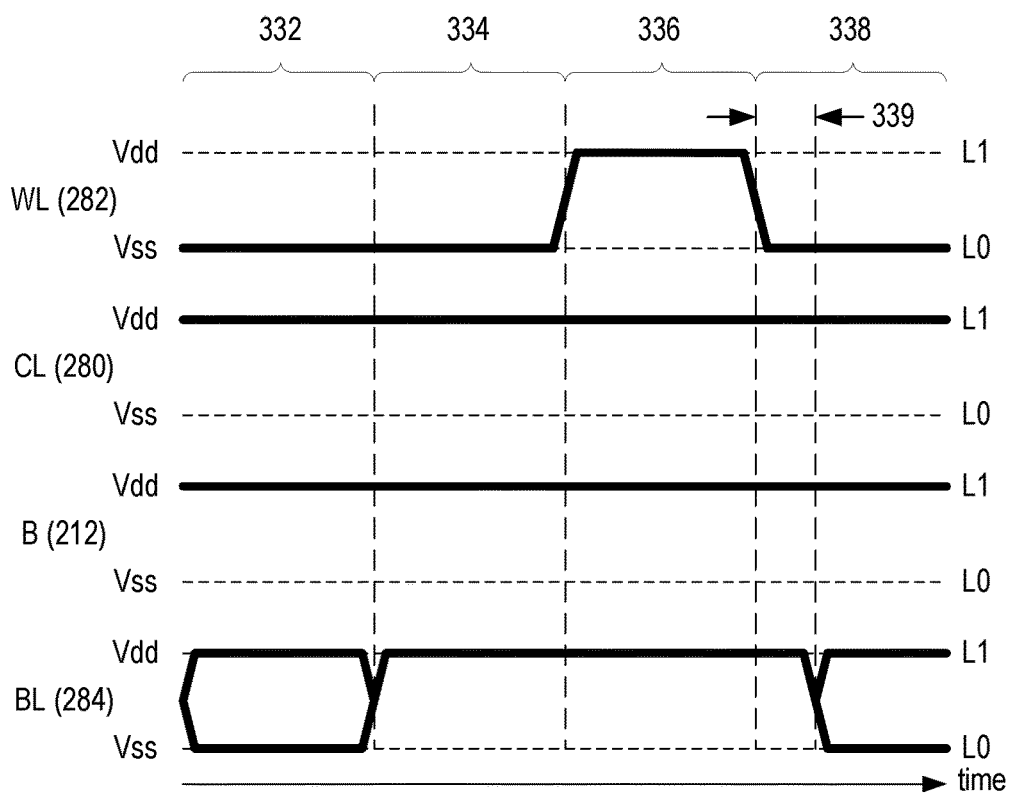
FIG. 3D is a timing diagram of an operation of reading a logic-1 value from the SRAM cell of FIGS. 2B and 2C, in accordance with some embodiments.

FIG. 3D shows a timing diagram of a read operation performed using the SRAM cell 200*u*, whereby the bit value L1 is read from the SRAM cell. In the example of FIG. 3D, four time periods 332, 334, 336, and 338 are illustrated. The second time period 334 and the third time period 336 correspond to the first and second stages of the read operation, respectively. The first time period 332 occurs prior to (e.g., immediately prior to) the first stage of the read operation, and the fourth time period 338 occurs after (e.g., immediately after) the second stage of the read operation.

During the first time period 332, the bit value B stored in the SRAM cell 200*u* at node 212 is L1, the bit value of the word line (WL) 282 is L0, and the bit value of the control line (CL) 280 is L1. Thus, each component of the SRAM cell 200*u* is in the same state during the time period 332 as in the time periods 302 and 318 of the examples of FIGS. 3A and 3B.

During the second time period 334 (the first stage of the read operation in FIG. 3D), the voltage of the bit line 284 is pre-charged to a predetermined value and then placed in a floating state (as discussed with reference to FIG. 3C). In the example of FIG. 3D, the bit line 284 is pre-charged to Vdd. Otherwise, the state of the SRAM cell 200*u* may remain the same from the first time period 332 to the second time period 334.

During the third time period 336 (the second stage of the read operation in FIG. 3D), the bit value B of the SRAM cell 200*u* is read out onto the bit line 284. To initiate the second stage of the read operation, the word line 282 and the control line 280 are both set to L1. Thus, referring to FIGS. 2B and 2C, the pull-up device 220*u* (pFET 222*u*) is off, the pull-up device 230*u* (pFET 232*u*) is off, and the pull-down device 240*d* (nFET 242*d*) is on. Since the bit value B stored by the latch 210 is L1, the node 212 is floating. In particular, the inverter 205*a* does not pull up the node 212 (because the pull-up device 230*u* is off, such that the pull-up stack 211*p*/232*u* is off) and does not pull down the node 212 (because the bit value at the input of the inverter 205*a* is L0, such that nFET 213*n* is off and pull-down stack 213*n*/242*d* is off). In addition, the access device 250*a* (nFET 252*n*) is on, and the bit line 284 is coupled to the node 212.

Consequently, the values of the bit line 284 and the node 212 both remain at L1. If the bit line 284 is pre-charged to a voltage less than Vdd during the first stage of the read operation, a portion of the charge of node 212 discharges onto the bit line 284 during the read operation's second stage, increasing the voltage of the bit line 284 and decreasing the voltage of the node 212. However, the voltages of the bit line 284 and the node 212 both represent the bit value L1 at the end of the read operation's second stage.

During the fourth time period 338, the value of the selection signal on the word line 282 is L0, the value of the control signal on the control line 280 is L1, and the bit value B stored in the SRAM cell 200 at node 212 is L1. Thus, each component of the SRAM cell 200*u* is in the same state during the time period 338 as in the time period 332. In some embodiments, the bit value that is driven onto the bit line 284 during the second stage of the read operation remains on the bit line 284 for at least a pre-determined time period 339 ("hold time") after the value of the word line 282 switches to L0, to give downstream circuits adequate time to latch the value of the bit line 284.

Thus, using the combination and sequence of input signals shown in time periods 334 and 336 of the timing diagram of FIG. 3D (also shown in time periods 324 and 326 of FIG. 3C), the bit value of the SRAM cell 200u may be read from the SRAM cell onto the bit line 284.

The SRAM cell 200u illustrated in FIG. 2B is just one example of an implementation of the SRAM cell 200 of FIG. 2A, and the circuit illustrated in FIG. 2C is just one embodiment of the SRAM cell 200u. Other implementations and embodiments are possible.

Figure 2D:
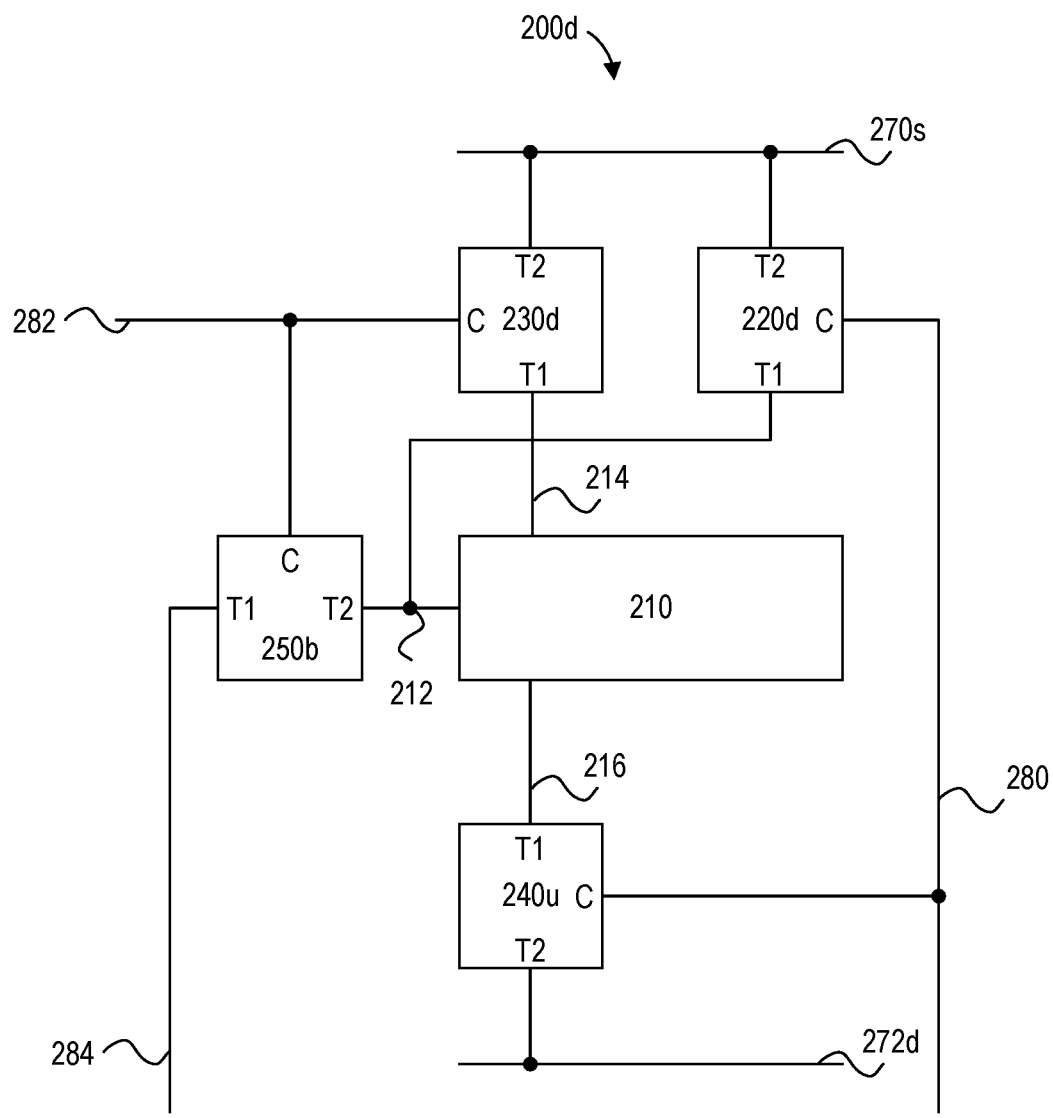
FIG. 2D is a block diagram of another embodiment of the SRAM cell of FIG. 2A.

For example, referring to FIG. 2D, the SRAM cell 200 of FIG. 2A may be implemented as an SRAM cell 200d. In some embodiments, the SRAM cell 200d can perform a two-stage write operation in which the bit value of node 212 is set to L0 (pulled down toward the voltage Vss of the power-supply rail 270s) during the first stage. In the second stage, the bit value of node 212 remains L0 if the value being written to the cell is L0, or switches to L1 (is pulled up toward the voltage Vdd of the power-supply rail 272d) if the value being written to the cell is L1. For ease of reference, the power-supply rail 272d may be referred to herein as the "supply rail" 272d, and the power-supply rail 270s may be referred to herein as the "ground rail" 270s.

The SRAM cell 200d includes a latch 210, pull-down devices 220d and 230d, a pull-up device 240u, and an access device 250b. The latch 210 stores a bit B at a node 212. The node 212 is coupled to the ground rail 270s via the pull-down device 220d. A terminal 214 of the latch 210 is coupled to the ground rail 270s via the pull-down device 230d, and a terminal 216 of the latch 210 is coupled to the supply rail 272d via the pull-up device 240u. The latch 210 can selectively pull down the potential of the node 212 toward Vss when the pull-down device 230d is activated (coupling the terminal 214 to the ground rail 270s), and can selectively pull up the potential of the node 212 toward Vdd when the pull-up device 240u is activated (coupling the terminal 216 to the supply rail 272d). The access device 250b provides read/write access to the bit B of the SRAM cell.

Some embodiments of the latch 210, the access device 250b, and the pulling devices (220d, 230d, 240u) of FIG. 2D are described above with reference, respectively, to the latch 210, the access device 250, and the pulling devices (220, 230, and 240) of FIG. 2A. For brevity, the descriptions of these devices are not repeated here. In some embodiments, each of the pull-down devices 220d and 230d is active when the bit value L1 is provided at the device's control terminal C. In some embodiments, the pull-up device 240u and the access device 250b are each active when the bit value L0 is provided at the device's control terminal C.

Based on the signals applied to the control line 280, the word line 282, and the bit line 284, the SRAM cell 200d may operate in an idle state, a read state, or a write state. In the idle state, the bit value at the node 212 is neither read nor written, and is stably maintained by the latch 210. In some embodiments, the SRAM cell 200d is placed in the idle state by (1) providing the bit value L1 on the word line 282, thereby activating the pull-down device 230d and deactivating the access device 250b, and (2) providing the bit value L0 on the control line 280, thereby activating the pull-up device 240u and deactivating the pull-down device 220d.

In the read state, the bit value at the node 212 is read out via the bit line 284. The SRAM cell 200d may be placed in the read state, for example, by activating the pull-up device 240u, deactivating the pull-down devices 220d and 230d, initializing the voltage of the bit line 284, placing the initialized bit line 284 in the floating state, and activating the access device 250b. The voltage of the bit line 284 may be initialized to a suitable value before activating the access device 250b. In some embodiments, the initial voltage of the bit line 284 is (1) the voltage Vss of the ground rail 270s, (2) any voltage within a range of voltages that represents the bit value (L0) represented by the voltage Vss of the ground rail 270s, or (3) a voltage that lies outside the range of voltages associated with the bit value L0 by less than a predetermined margin.

Depending on the bit value of the node 212, two scenarios are possible during a read operation. In the first scenario, the bit value of the node 212 is L0. In this scenario, the node 212 floats during the read operation. Thus, when the access device 250b is activated, the voltage on the bit line 284 ($V_{BL}$) and the voltage ($W_{ELL}$) at the node 212 begin to equalize, such that $V_{BL}$ and $V_{CELL}$ are both within the range of voltages associated with the bit value L0 at the end of the read operation. In the second scenario, the bit value of the node 212 is L1. In this scenario, the latch 210 pulls up the voltage of the node 212 toward the voltage Vdd of the supply rail 272d. Thus, when the access device 250b is activated, the latch pulls up the voltage of the bit line 284 toward the voltage of the supply rail 272d as well, such that $V_{BL}$ and $V_{CELL}$ are both within the range of voltages associated with the bit value L1 at the end of the read operation.

In some embodiments, the SRAM cell 200d is placed in the read state by providing the bit value L0 on the word line 282 and on the control line 280. The value of the bit line 284 may be initialized and the bit line may be placed in the floating state before providing the bit value L0 on the word line 282, to avoid disturbing the stored bit value of the SRAM cell.

In the write state, a new bit value is written to the node 212 via the bit line 284. The write state may include two successive stages. In the first stage, the node 212 may be decoupled from the supply rail 272d and the bit line 284 by deactivating the pull-up device 240u and the access device 250b, and the voltage of the node 212 may be pulled down toward the voltage Vss of the ground rail 270s via the pull-down device 220d, thereby setting the bit value of the node 212 to L0.

In the second stage, the node 212 may be decoupled from the ground rail 270s by deactivating the pull-down devices 220d and 230d, and coupled to the bit line 284 via the access device 250b. If the bit value on the bit line 284 is L1, the L1 value on the bit line overrides the L0 value at the node 212, and the latch 210 pulls the voltage of the node 212 toward the voltage of the supply rail 272d via the pull-up device 240u. Otherwise, all the pulling devices in the cell are inactive during the second stage of the write operation, and the node 212 continues to store the bit value L0.

In some embodiments, the SRAM cell 200d is placed in the first stage of the write state by providing the bit value L1 on the word line 282 and on the control line 280. In some embodiments, the SRAM cell 200d is placed in the second stage of the write state by providing the bit value L0 on the word line 282 and on the control line 280, while also driving the bit value B to be written to the SRAM cell on the bit line 284.

Figure 2E:
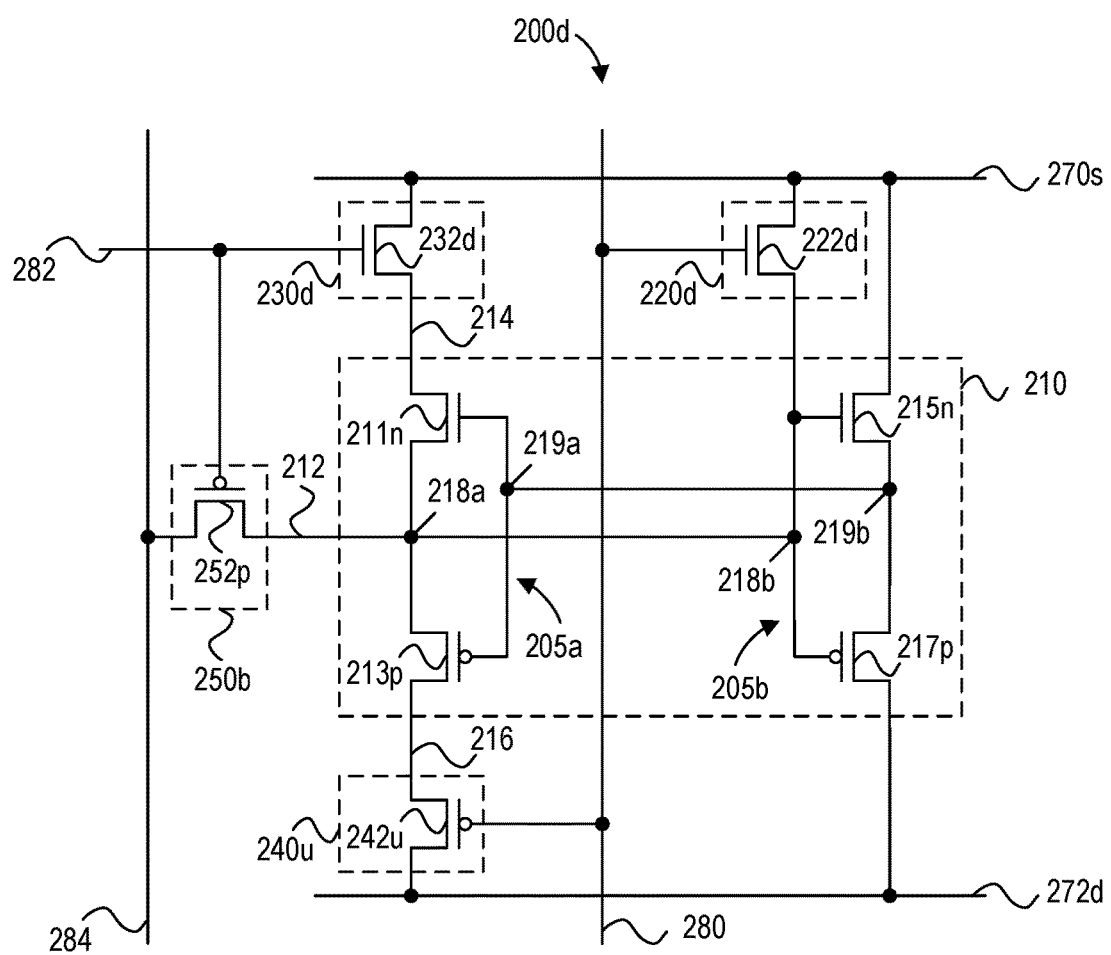
FIG. 2E is a schematic of the SRAM cell of FIG. 2D, in accordance with some embodiments.

Referring to FIG. 2E, in an embodiment of the SRAM cell 200d, the latch 210 may be implemented using cross-coupled CMOS inverters 205a and 205b, the pull-down devices 220d and 230d may be implemented using nFETs 222d and 232d, respectively, the pull-up device 240u may be implemented using a pFET 242u, and the access device 250b may be implemented using a pFET 252p. The arrangement of devices in FIG. 2E is described in further detail below.

In the example of FIG. 2E, the latch 210 is implemented using cross-coupled inverters 205a and 205b. The inverter 205a includes an nFET 211n and a pFET 213p. The gates of the nFET 211n and the pFET 213p are coupled together to form the input 219a of the inverter 205a. Diffusion terminals (e.g., drains) of the nFET 211n and the pFET 213p are coupled together to form the output 218a of the inverter 205a, which is also the node 212 where the bit value B of the SRAM cell 200d is stored. The other diffusion terminals (e.g., sources) of the nFET 211n and the pFET 213p are coupled, respectively, to terminals 214 and 216 of the latch 210.

Likewise, the inverter 205b includes an nFET 215n and a pFET 217p. The gates of the nFET 215n and the pFET 217p are coupled together to form the input 218b of the inverter 205b. Diffusion terminals (e.g., drains) of the nFET 215n and the pFET 217p are coupled together to form the output 219b of the inverter 205b, which is also the node where the inverse B' of the bit value B of the SRAM cell 200d is stored. The other diffusion terminals (e.g., sources) of the nFET 215n and the pFET 217p are coupled, respectively, to the ground rail 270s and the supply rail 272d.

In the example of FIG. 2E, the pull-down device 220d is implemented using an nFET 222d. In particular, one diffusion terminal (e.g., drain) of the nFET 222d is coupled to the node 212, and the other diffusion terminal (e.g., source) of the nFET 222d is coupled to the ground rail 270s. The gate of the nFET 222d is coupled to the control line 280, such that the nFET 222d is on when the control line 280 provides the bit value L1. Other implementations of the pull-down device 220d are possible. In some embodiments, the pull-down device 220d includes a stack of two or more nFETs with their diffusion terminals coupled in series between the node 212 and the ground rail 270s, and with their gates coupled to the control line 280.

In the example of FIG. 2E, the pull-down device 230d is implemented using an nFET 232d. In particular, one diffusion terminal (e.g., drain) of the nFET 232d is coupled to the latch terminal 214, and the other diffusion terminal (e.g., source) of the nFET 232d is coupled to the ground rail 270s. The gate of the nFET 232d is coupled to the word line 282, such that the nFET 232d is on when the word line 282 provides the bit value L1. Other implementations of the pull-down device 230d are possible. In some embodiments, the pull-down device 230d includes a stack of two or more nFETs with their diffusion terminals coupled in series between the latch terminal 214 and the ground rail 270s, and with their gates coupled to the word line 282.

In the example of FIG. 2E, the pull-up device 240u is implemented using a pFET 242u. In particular, one diffusion terminal (e.g., drain) of the pFET 242u is coupled to the latch terminal 216, and the other diffusion terminal (e.g., source) of the pFET 242u is coupled to the supply rail 272d. The gate of the pFET 242u is coupled to the control line 280, such that the pFET 242u is on when the control line 280 provides the bit value L0. Other implementations of the pull-up device 240u are possible. In some embodiments, the pull-up device 240u includes a stack of two or more pFETs with their diffusion terminals coupled in series between the latch terminal 216 and the supply rail 272d, and with their gates coupled to the control line 280.

In the example of FIG. 2E, the access device 250b is implemented using a pFET 252p. In particular, the diffusion terminals of the pFET 252p are coupled, respectively, to the bit line 284 and the node 212 of the SRAM cell. The gate of the pFET 252p is coupled to the word line 282, such that the pFET 252p is on when the word line 282 provides the bit value L0. Other implementations of the access device 250b are possible. In some embodiments, the access device 250b is implemented using a transmission gate, with the control gate of the transmission gate's pFET coupled to the word line 282, the control gate of the transmission gate's nFET coupled to receive the inverse of the signal provided on the word line 282, and the switch terminals of the transmission gate coupled, respectively, to the bit line 284 and the node 212.

Figure 4A:
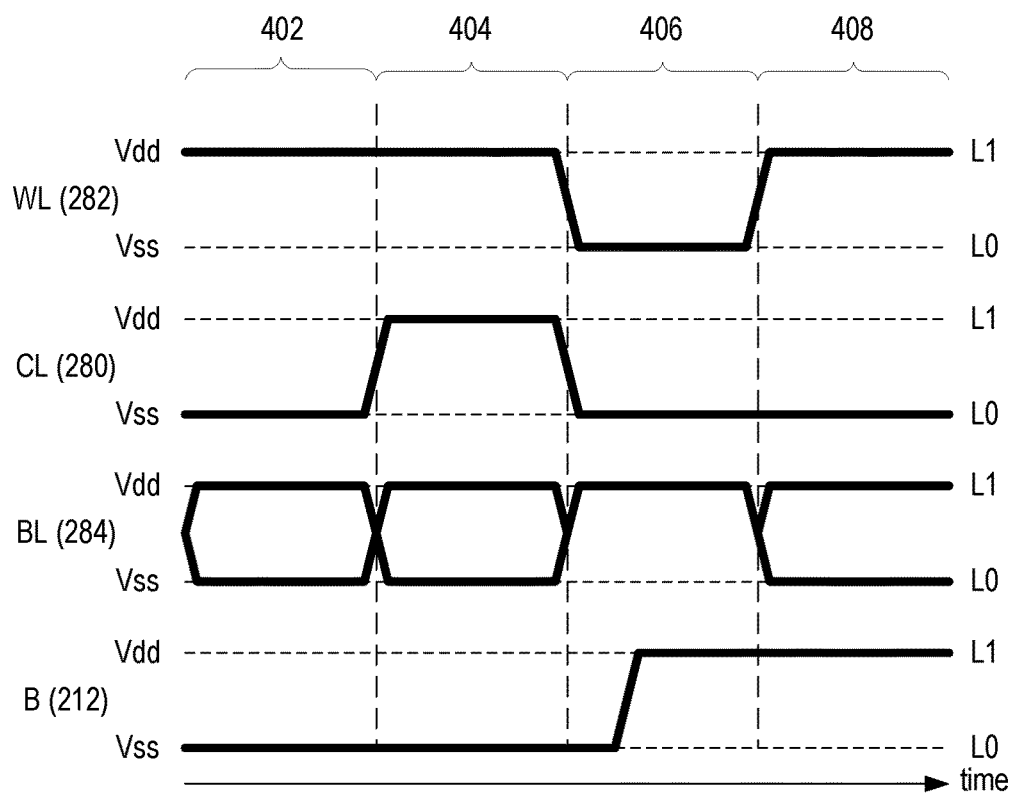
FIG. 4A is a timing diagram of an operation of writing a logic-1 value into the SRAM cell of FIGS. 2D and 2E, in accordance with some embodiments.

FIG. 4A shows a timing diagram of a write operation performed using the SRAM cell 200d, whereby the bit value L1 is written to the SRAM cell. In the example of FIG. 4A, four time periods 402, 404, 406, and 408 are illustrated. The second time period 404 and the third time period 406 correspond to the first and second stages of the write operation, respectively. The first time period 402 occurs prior to (e.g., immediately prior to) the first stage of the write operation, and the fourth time period 408 occurs after (e.g., immediately after) the second stage of the write operation.

During the first time period 402, the bit value ("B") stored in the SRAM cell 200d at node 212 is L0, the bit value of the word line ("WL") 282 is L1, the bit value of the control line 280 ("CL") is L0, and the SRAM cell 200d is in the idle state. Referring to FIG. 2D, the pull-down device 230d is on, the pull-down device 220d is off, and the latch 210 is pulling down the node 212 to the ground rail 270s via the pull-down device 230d. In the example of FIG. 2E, nFET 232d is on, nFET 222d is off, the inverter 205a of the latch 210 is outputting L0, and the inverter 205b of the latch 210 is outputting L1. In particular, since the bit value of node 212 is L0, the value at the input 218b of the inverter 205b is also L0, pFET 217p is on, nFET 215n is off, and the value at the output 219b of the inverter 205b is L1. Thus, the value at node 219a is also L1, so pFET 213p is off and nFET 211n is on. The pull-down stack (nFETs 211n and 232d) is therefore pulling down the voltage of the node 212 to the voltage Vss of the ground rail 270s, and the pull-up stack (pFETs 213p and 242u) is off. In addition, the access device 250b is off (pFET 252p is off), so the bit line 284 is decoupled from the node 212, and the value on the bit line 284 can be L0 or L1.

During the second time period 404 (the first stage of the write operation in FIG. 4A), a bit value of L0 is stored at node 212 of the SRAM cell 200d. To reduce or eliminate contention between pull-up and pull-down devices during the first stage of the write operation, the word line 282 and the control line 280 are both set to L1. Thus, referring to FIGS. 2D and 2E, the pull-down device 220d (nFET 222d) is on, the pull-down device 230d (nFET 232d) is on, and the pull-up device 240u (pFET 242u) is off. As a result, the node 212 is coupled to the ground rail 270s, and the bit value B of node 212 is therefore pulled down to L0. In particular, the value at the input 218b of the inverter 205b remains L0, the value at the output 219b of the inverter 205b remains L1, the pFET 213p remains off, and the nFET 211n remains on. Thus, nFET 222d and nFET stack 211n/232d pull down the voltage of the node 212 to Vss, and the pull-up stack (pFETs 213*p* and 242*u*) is off. The access device 250*b* (pFET 252*p*) remains off, so the bit line 284 remains decoupled from the node 212.

During the third time period 406 (the second stage of the write operation in FIG. 4A), the bit value L1 is written to the SRAM cell 200*d*. To reduce or eliminate contention between pull-up and pull-down devices during the second stage of the write operation, the word line 282 and the control line 280 are both set to L0. Thus, referring to FIGS. 2D and 2E, the pull-down device 220*d* (nFET 222*d*) is off, the pull-down device 230*d* (nFET 232*d*) is off, and the pull-up device 240*u* (pFET 242*u*) is on. The latch 210 is therefore able to selectively pull up (but not pull down) the voltage of node 212.

In addition, the access device 250*b* (pFET 252*p*) is on, so the bit line 284 is coupled to the node 212, and the bit value (L1) being written to the cell is driven to the node 212 via the bit line 284. Referring to FIG. 2D, the bit line 284 at least partially charges the node 212. After the voltage of the node 212 rises above a predetermined value, some embodiments of the latch 210 permit the pull-up device 240*u* to assist with the charging of the node 212. In the example of FIG. 2E, when the voltage of the node 212 rises to a value corresponding to bit value L1, the output 219*b* of the inverter 205*b* switches to L0, thereby activating pFET 213*p*, and the voltage of the node 212 is pulled up to the voltage Vdd of the supply rail 272*d* via the pFETs 213*p* and 242*u*. In this manner, the bit value B stored at the node 212 changes to L1.

During the fourth time period 408, the bit value B stored in the SRAM cell 200*d* at node 212 is L1, the value of the word line 282 is L1, the value of the control line 280 is L0, and the SRAM cell 200*d* is in the idle state. Referring to FIG. 2D, the pull-down device 220*d* is off, the pull-up device 240*u* is on, and the latch 210 is pulling up the node 212 to the supply rail 272*d*. In the example of FIG. 2E, nFET 222*d* is off, pFET 242*u* is on, the inverter 205*a* of the latch 210 is outputting L1, and the inverter 205*b* of the latch 210 is outputting L0. In particular, since the bit value of node 212 is L1, the value at the input 218*b* of the inverter 205*b* is also L1, pFET 217*p* is off, nFET 215*n* is on, and the value at the output 219*b* of the inverter 205*b* is L0. Thus, the value at node 219*a* is also L0, so pFET 213*p* is on and nFET 211*n* is off. The pull-up stack (pFETs 213*p* and 242*u*) is therefore pulling up the voltage of the node 212 to the voltage Vdd of the supply rail 272*d*, and the pull-down stack (nFETs 211*n* and 232*d*) is off. In addition, the access device 250*b* (pFET 252*p*) is off, so the bit line 284 is decoupled from the node 212.

Thus, using the combination and sequence of input signals shown in time periods 404 and 406 of the timing diagram of FIG. 4A, the value L1 may be written into the SRAM cell 200*d* without experiencing contention between pull-up devices and pull-down devices at the node 212 that stores the cell's bit value.

In the example of FIG. 4A, the SRAM cell 200*d* stores the bit value L0 (in time period 402) prior to performing a write operation (in time periods 404 and 406) that overwrites the L0 value with an L1 value. The SRAM cell 200*d* is not limited in this regard. One of ordinary skill in the art will appreciate that prior to writing an L1 value to the SRAM cell 200*d*, the bit value stored by the cell can be either L0 or L1.

Figure 4B:
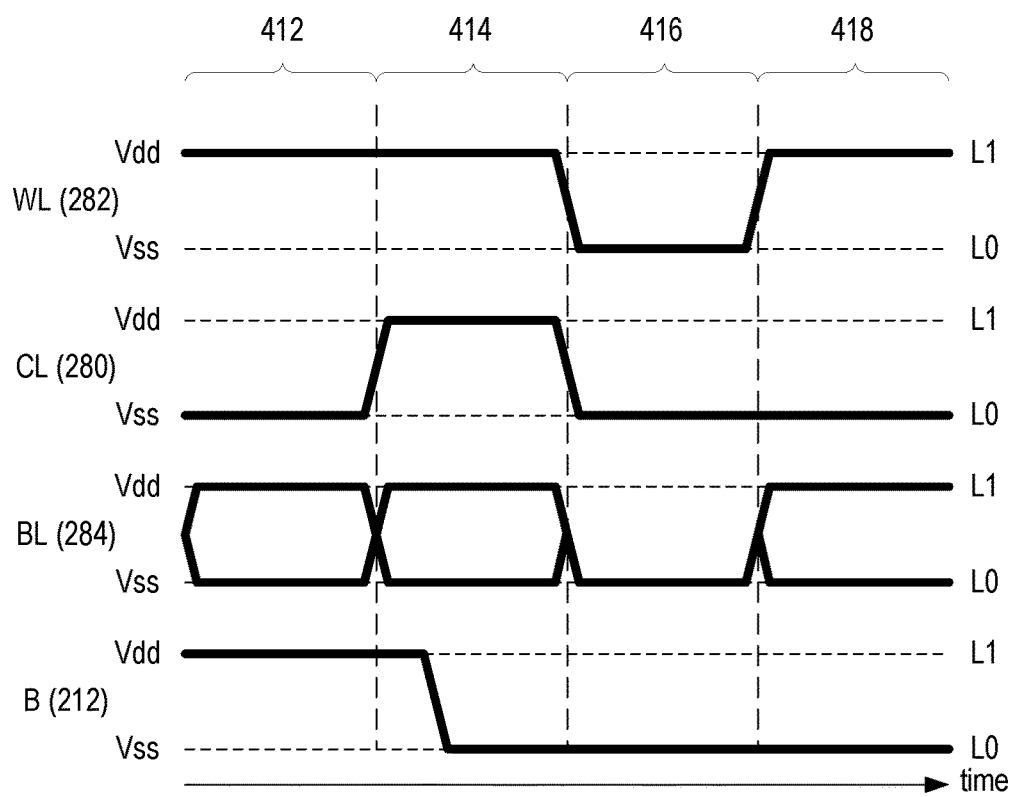
FIG. 4B is a timing diagram of an operation of writing a logic-0 value into the SRAM cell of FIGS. 2D and 2E, in accordance with some embodiments.

FIG. 4B shows a timing diagram of a write operation performed using the SRAM cell 200*d*, whereby the bit value L0 is written to the SRAM cell. In the example of FIG. 4B, four time periods 412, 414, 416, and 418 are illustrated. The second and third time periods 414 and 416 correspond to the first and second stages of the write operation, respectively.

The first time period 412 occurs prior to (e.g., immediately prior to) the first stage of the write operation, and the fourth time period 418 occurs after (e.g., immediately after) the second stage of the write operation.

During the first time period 402, the bit value B stored in the SRAM cell 200*d* at node 212 is L1, the bit value of the word line (WL) 282 is L1, the bit value of the control line (CL) 280 is L0, and the SRAM cell 200*d* is in the idle state. Thus, each component of the SRAM cell 200*d* is in the same state during the time period 412 as in the time period 408.

During the second time period 414 (the first stage of the write operation in FIG. 4B), the bit value of the SRAM cell 200*d* is pulled down to L0. As in the second time period 404 in the example of FIG. 4A, the word line 282 and the control line 280 are both set to L1. Thus, referring to FIGS. 2D and 2E, the pull-down device 220*d* (nFET 222*d*) is on, the pull-down device 230*d* (nFET 232*d*) is on, and the pull-up device 240*u* (pFET 242*u*) is off. Accordingly, the node 212 is coupled to the ground rail 270*s*, and the bit value B of node 212 is pulled down toward the voltage Vss of the ground rail 270*s*, such that the cell's bit value B changes from L1 to L0.

In particular, referring to FIG. 2D, the voltage of the node 212 is initially pulled down toward the voltage Vss of the ground rail 270*s* by the pull-down device 220*d*. After the voltage of the node 212 falls below a predetermined value, some embodiments of the latch 210 permit the pull-down device 230*d* to assist in pulling down the voltage of the node 212. In the example of FIG. 2E, when the voltage of the node 212 falls to a value corresponding to bit value L0, the output 219*b* of the inverter 205*b* switches to L1, thereby activating nFET 213*n*, and the voltage of the node 212 is pulled down to the voltage Vss of the ground rail 272*d* via the nFET 222*d* and the nFET stack 211*n*/232*d*. In this manner, the bit value B stored at the node 212 changes to L0. The access device 250*b* (pFET 252*p*) remains off, so the bit line 284 remains decoupled from the node 212.

During the third time period 416 (the second stage of the write operation in FIG. 4B), the bit value B of the SRAM cell 200*d* remains L0. As in the third time period 406 in the example of FIG. 4A, the word line 282 and the control line 280 are both set to L0. Thus, referring to FIGS. 2D and 2E, the pull-down device 220*d* (nFET 222*d*) is off, the pull-down device 230*d* (nFET 232*d*) is off, and the inverter 205*a* of the latch 210 is not pulling up the node 212 because the pFET 213*p* of the pull-up stack 213*p*/242*u* is off. In addition, the access device 250*b* (pFET 252*p*) is on, so the bit line 284 is coupled to the node 212, and the bit value (L0) being written to the cell is driven to the node 212 via the bit line 284.

With the pull-down devices (220*d*, 230*d*) off and the bit value L0 being driven on the bit line 284, the bit value B stored at node 212 (L0) does not change. Referring to FIG. 2D, the latch 210 is configured to maintain its bit value unless that bit value is overridden by an external device. In particular, referring to FIG. 2E, the value at the input 218*b* of the inverter 205*b* remains L0, the value at the output 219*b* of the inverter 205*b* remains L1, and the pFET 213*p* remains off. Thus, the voltage of the node 212 is not pulled up, and the bit value of the SRAM cell 200*d* remains L0.

During the fourth time period 418, the value of the selection signal on the word line 282 is L1, the value of the control signal on the control line 280 is L0, and the bit value B stored in the SRAM cell 200*d* at node 212 is L0. Thus, each component of the SRAM cell 200*d* is in the same state during the time period 418 as in the time period 402.

Thus, using the combination and sequence of input signals shown in time periods 414 and 416 of the timing diagram of FIG. 4B, the value L0 may be written into the SRAM cell 200*d* without experiencing contention between pull-up devices and pull-down devices at the node 212 that stores the bit value B of the SRAM cell.

In the example of FIG. 4B, the SRAM cell 200*d* stores the bit value L1 (in time period 412) prior to performing a write operation (in time periods 414 and 416) that overwrites the L1 value with an L0 value. The SRAM cell 200*d* is not limited in this regard. One of ordinary skill in the art will appreciate that prior to writing an L0 value to the SRAM cell 200*d*, the bit value stored by the cell can be either L0 or L1.

Figure 4C:
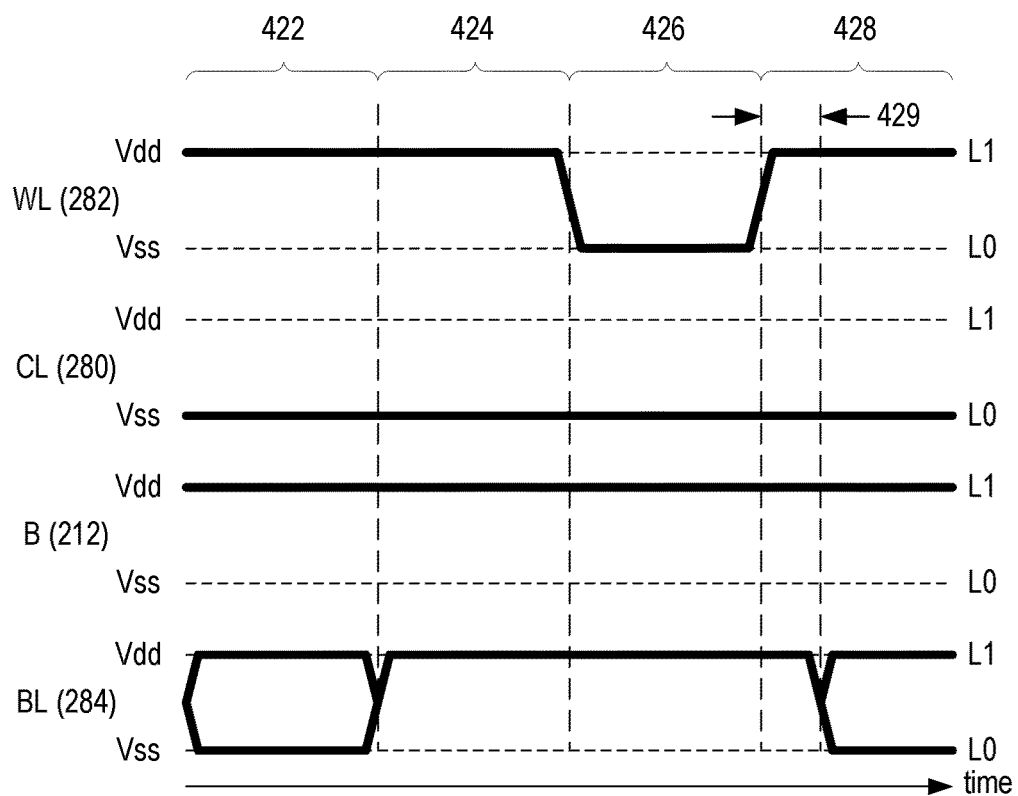
FIG. 4C is a timing diagram of an operation of reading a logic-1 value from the SRAM cell of FIGS. 2D and 2E, in accordance with some embodiments.

FIG. 4C shows a timing diagram of a read operation performed using the SRAM cell 200*d*, whereby the bit value L1 is read from the SRAM cell. In the example of FIG. 4C, four time periods 422, 424, 426, and 428 are illustrated. The second time period 424 and the third time period 426 correspond to the first and second stages of the read operation, respectively. The first time period 422 occurs prior to (e.g., immediately prior to) the first stage of the read operation, and the fourth time period 428 occurs after (e.g., immediately after) the second stage of the read operation.

During the first time period 422, the bit value ("B") stored in the SRAM cell 200*d* at node 212 is L1, the bit value of the word line ("WL") 282 is L1, and the bit value of the control line ("CL") 280 is L0. Thus, as in time periods 408 and 412 of the examples of FIGS. 4A and 4B, the pull-down device 220*d* (nFET 222*d*) is off, the pull-up device 240*u* (pFET 242*u*) is on, and the latch 210 is pulling up the node 212 to the supply rail 272*d*. In addition, the access device 250*b* (pFET 252*p*) is off, so the bit line 284 is decoupled from the node 212, and the value on the bit line 284 can be L0 or L1.

During the second time period 424 (the first stage of the read operation in FIG. 4C), the voltage of the bit line 284 is set ("pre-discharged") to a predetermined value and then placed in a floating state. In the example of FIG. 4C, the bit line 284 is pre-discharged to Vss, but any other voltage suitable for reading out the bit value of the SRAM cell 200*d* may be used (e.g., Vss, any voltage that represents the bit value L0, etc.). Otherwise, the state of the SRAM cell 200*d* may remain the same from the first time period 422 to the second time period 424.

During the third time period 426 (the second stage of the read operation in FIG. 4C), the bit value B of the SRAM cell 200*d* is read out onto the bit line 284. To initiate the second stage of the read operation, the word line 282 and the control line 280 are both set to L0. Thus, referring to FIGS. 2D and 2E, the pull-down device 220*d* (nFET 222*d*) is off, the pull-down device 230*d* (nFET 232*d*) is off, and the pull-up device 240*u* (pFET 242*u*) is on. Since the bit value B stored by the latch 210 is L1, the latch 210 pulls up the voltage of the node 212 via the pull-up device 240*u*. In particular, the inverter 205*a* of the latch 210 pulls up the voltage of the node 212 via the pull-up stack of pFETs 213*p* and 242*u*. In addition, the access device 250*b* (pFET 252*p*) is on, and the bit line 284 is coupled to the node 212. Consequently, the bit line 284 is also pulled up via the latch 210 and the pull-up device 240*u*, thereby charging the pre-discharged voltage of the bit line 284 and setting the value of the bit line 284 to L1.

During the fourth time period 428, the value of the selection signal on the word line 282 is L1, the value of the control signal on the control line 280 is L0, and the bit value B stored in the SRAM cell 200*d* at node 212 is L1. Thus, each component of the SRAM cell 200*d* is in the same state during the time period 428 as in the time period 422. In some embodiments, the bit value that was driven onto the bit line during the second stage of the read operation remains on the bit line for at least a pre-determined time period 429 ("hold time") after the value of the word line 282 switches to L1, to give downstream circuits adequate time to latch the value of the bit line 284.

Figure 4D:
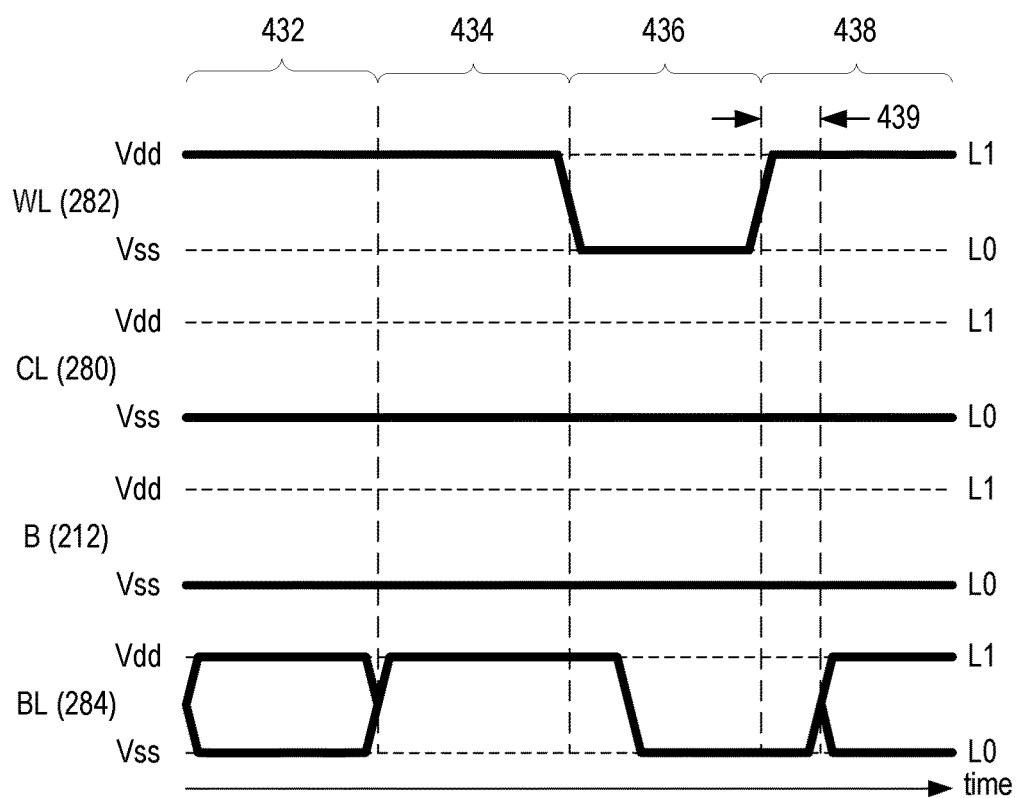
FIG. 4D is a timing diagram of an operation of reading a logic-0 value from the SRAM cell of FIGS. 2D and 2E, in accordance with some embodiments.

FIG. 4D shows a timing diagram of a read operation performed using the SRAM cell 200*d*, whereby the bit value L0 is read from the SRAM cell. In the example of FIG. 4D, four time periods 432, 434, 436, and 438 are illustrated. The second time period 434 and the third time period 436 correspond to the first and second stages of the read operation, respectively. The first time period 432 occurs prior to (e.g., immediately prior to) the first stage of the read operation, and the fourth time period 438 occurs after (e.g., immediately after) the second stage of the read operation.

During the first time period 432, the bit value B stored in the SRAM cell 200*d* at node 212 is L0, the bit value of the word line (WL) 282 is L1, and the bit value of the control line (CL) 280 is L0. Thus, each component of the SRAM cell 200*d* is in the same state during the time period 432 as in the time periods 402 and 418 of the examples of FIGS. 4A and 4B.

During the second time period 434 (the first stage of the read operation in FIG. 4D), the voltage of the bit line 284 is pre-discharged to a predetermined value and then placed in a floating state (as discussed with reference to FIG. 4C). In the example of FIG. 4D, the bit line 284 is pre-discharged to Vss. Otherwise, the state of the SRAM cell 200*d* may remain the same from the first time period 432 to the second time period 434.

During the third time period 436 (the second stage of the read operation in FIG. 4D), the bit value B of the SRAM cell 200*d* is read out onto the bit line 284. To initiate the second stage of the read operation, the word line 282 and the control line 280 are both set to L0. Thus, referring to FIGS. 2D and 2E, the pull-down device 220*d* (nFET 222*d*) is off, the pull-down device 230*d* (nFET 232*d*) is off, and the pull-up device 240*u* (pFET 242*u*) is on. Since the bit value B stored by the latch 210 is L0, the node 212 is floating. In particular, the inverter 205*a* does not pull down the node 212 (because the pull-down device 230*d* is off, such that the pull-down stack 211*n*/232*d* is off) and does not pull up the node 212 (because the bit value at the input of the inverter 205*a* is L1, such that pFET 213*p* is off and pull-up stack 213*p*/242*u* is off). In addition, the access device 250*b* (pFET 252*p*) is on, and the bit line 284 is coupled to the node 212.

Consequently, the values of the bit line 284 and the node 212 both remain at L0. If the bit line 284 is pre-discharged to a voltage greater than Vss during the first stage of the read operation, a portion of the charge of the bit line 284 discharges onto the node 212 during the read operation's second stage, decreasing the voltage of the bit line 284 and increasing the voltage of the node 212. However, the voltages of the bit line 284 and the node 212 both represent the bit value L0 at the end of the read operation's second stage.

During the fourth time period 438, the value of the selection signal on the word line 282 is L1, the value of the control signal on the control line 280 is L0, and the bit value B stored in the SRAM cell 200*d* at node 212 is L0. Thus, each component of the SRAM cell 200*d* is in the same state during the time period 438 as in the time period 432. In some embodiments, the bit value that is driven onto the bit line 284 during the second stage of the read operation remains on the bit line 284 for at least a pre-determined time period 439

("hold time") after the value of the word line 282 switches to L1, to give downstream circuits adequate time to latch the value of the bit line 284.

Thus, using the combination and sequence of input signals shown in time periods 434 and 436 of the timing diagram of FIG. 4D (also shown in time periods 424 and 426 of FIG. 4C), the bit value of the SRAM cell 200d may be read from the SRAM cell onto the bit line 284.

Figure 5:
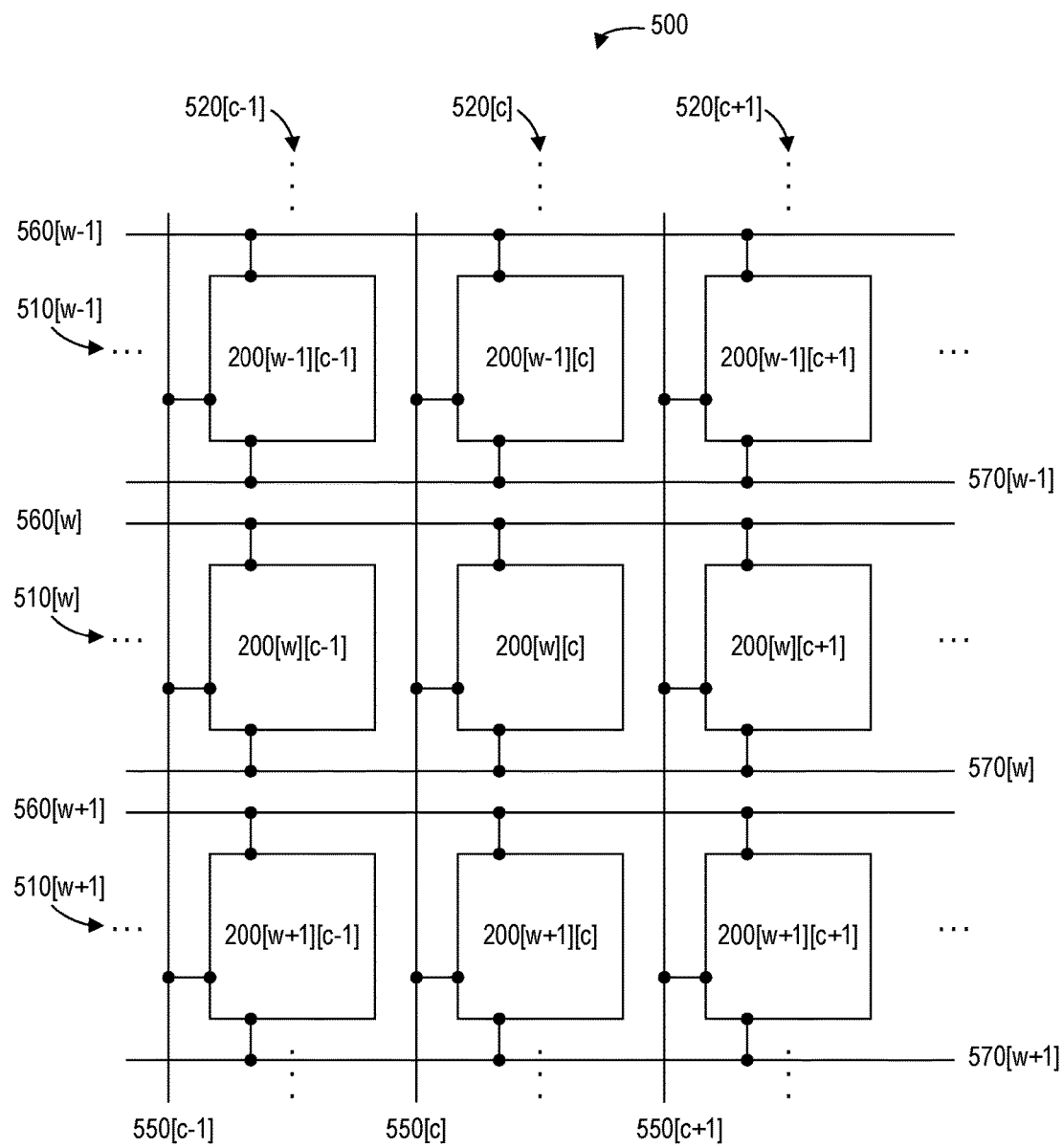
FIG. 5 is a block diagram of an array of SRAM cells, in accordance with some embodiments.

Referring now to FIG. 5, an SRAM array 500 includes a plurality of SRAM cells 200 arranged in rows 510 and columns 520. Some embodiments of the SRAM cells 200 are described above. In the example of FIG. 5, the SRAM cells are indicated by the reference number 200 followed by a row index and a column index, both in brackets.

The SRAM array also includes row lines 560, column lines 550, and write lines 570. Each of the row lines and write lines is indicated by the corresponding reference number (560 or 570) followed by a bracketed row index, and each column line is indicated by the corresponding reference number (550) and a bracketed column index. The row lines, write lines, and column lines may be controlled, for example, by a memory controller, as described below with reference to FIG. 6. The word line, control line, and bit line of each SRAM cell 200[w][c] are coupled, respectively, to the row line 560[w], write line 570[w], and column line 550[c] corresponding to the SRAM cell's row [w] and column [c].

In some embodiments, the SRAM array 500 may include $2^M$ rows and N columns. The set of N bits contained in a row may be referred to herein as a memory "word." In some embodiments, the bits of a memory word may be accessed (e.g., read and/or written) in parallel.

For example, in an array 500 of SRAM cells 200u, the bits of a memory word 200[w][1 . . . N] may be written in parallel by (1) setting the bit value of the row line 560[w] to L0 in a first time period and L1 in a second time period (as shown, for example, on the word line (WL) 282 in time periods 304 and 306 in FIG. 3A), (2) setting the bit value of the write line 570[w] to L0 in the first time period and L1 in the second time period (as shown, for example, on the control line (CL) 280 in time periods 304 and 306 in FIG. 3A), and (3) setting the bit values of the column lines 550[1 . . . N] to the bit values to be written into the selected memory word during the third time period (as shown for one column line, for example, on the bit line (BL) 284 in time period 306 in FIG. 3A).

Likewise, in an array 500 of SRAM cells 200u, the bits of a memory word 200[w][1 . . . N] may be read in parallel by (1) setting the bit value of the row line 560[w] to L0 in a first time period and L1 in a second time period (as shown, for example, on the word line (WL) 282 in time periods 324 and 326 in FIG. 3C), (2) setting the bit value of the write line 570[w] to L1 in the first and second time periods (as shown, for example, on the control line (CL) 280 in time periods 324 and 326 in FIG. 3C), (3) pre-charging the bit values of the column lines 550 to suitable values (e.g., Vdd) during the second time period (as shown, for example, on the bit line (BL) 284 in time period 324 in FIG. 3C), and (4) placing the column lines 550 in a floating state during the third time period. The bit values of the selected word 200[w][1 . . . N] may then be read out onto the column lines 550 during the third time period (as shown for one column line, for example, on the bit line (BL) 284 in time period 326 in FIG. 3C).

One of ordinary skill in the art will appreciate that the SRAM cells 200u of a memory word 200[w] may be placed in the idle state by setting the bit value of the row line 560[w] to L0 and setting the bit value of the write line 570[w] to L1.

As another example, in an array 500 of SRAM cells 200d, the bits of a memory word 200[w][1 . . . N] may be written in parallel by (1) setting the bit value of the row line 560[w] to L1 in a first time period and L0 in a second time period (as shown, for example, on the word line (WL) 282 in time periods 404 and 406 in FIG. 4A), (2) setting the bit value of the write line 570[w] to L1 in the first time period and L0 in the second time period (as shown for one column line, for example, on the control line (CL) 280 in time periods 404 and 406 in FIG. 4A), and (3) setting the bit values of the column lines 550[1 . . . N] to the bit values to be written into the selected memory word during the third time period (as shown for one column line, for example, on the bit line (BL) 284 in time period 406 in FIG. 4A).

Likewise, in an array 500 of SRAM cells 200d, the bits of a memory word 200[w][1 . . . N] may be read in parallel by (1) setting the bit value of the row line 560[w] to L1 in a first time period and L0 in a second time period (as shown, for example, on the word line (WL) 282 in time periods 424 and 426 in FIG. 4C), (2) setting the bit value of the write line 570[w] to L0 in the first and second time periods (as shown, for example, on the control line (CL) 280 in time periods 424 and 426 in FIG. 4C), (3) pre-discharging the bit values of the column lines 550 to suitable values (e.g., Vss) during the second time period (as shown for one column line, for example, on the bit line (BL) 284 in time period 424 in FIG. 4C), and (4) placing the column lines 550 in a floating state during the third time period. The bit values of the selected word 200[w][1 . . . N] may then be read out onto the column lines 550 during the third time period (as shown for one column line, for example, on the bit line (BL) 284 in time period 426 in FIG. 4C).

One of ordinary skill in the art will appreciate that the SRAM cells 200d of a memory word 200[w] may be placed in the idle state by setting the bit value of the row line 560[w] to L1 and setting the bit value of the write line 570[w] to L0.

Figure 6:
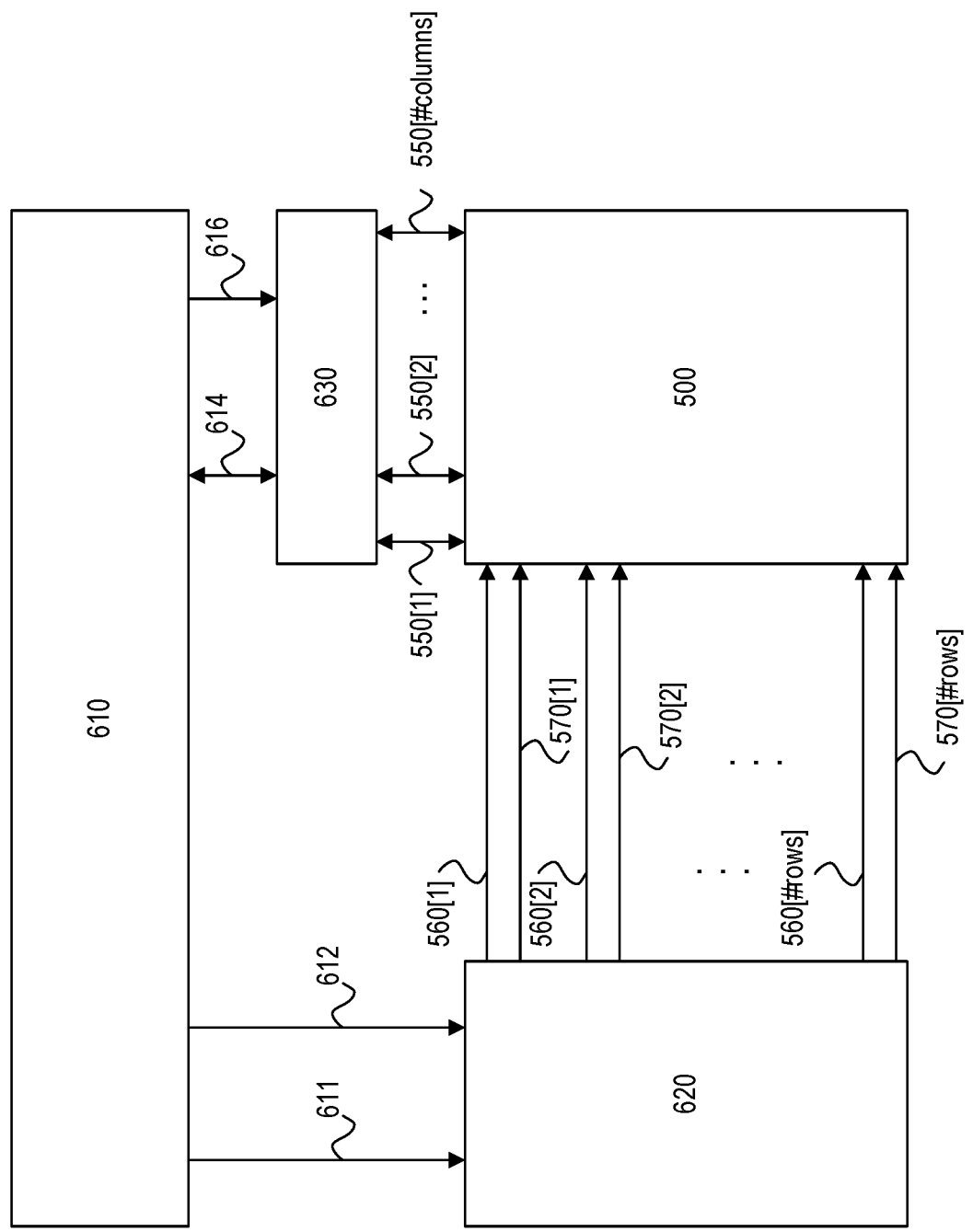
FIG. 6 is a block diagram of an SRAM system, in accordance with some embodiments.

Referring now to FIG. 6, an SRAM system 600 may include an SRAM array 500, a memory controller 610, a row decoder 620, and an input/output (I/O) unit 630. To read data from a particular word in the SRAM array 500, the memory controller 610 provides the address of the word to the row decoder 620 via address bus 611, and provides suitable control signals to the row decoder 620 and the I/O unit 630 via control lines 612 and 616, respectively. The I/O unit 630 then provides the bits of the selected word to the memory controller 610 via data bus 614. To write data to a particular word in the SRAM array 500, the memory controller 610 provides the address of the word to the row decoder 620 via address bus 611, provides the bits to be written to the word to the I/O unit 630 via data bus 614, and provides suitable control signals to the row decoder 620 and the I/O unit 630 via control lines 612 and 616, respectively.

In some embodiments, the address is an M-bit address, the number of words in the SRAM array 500 is $2^M$, and the number of row lines 560 is $2^M$, with each row line corresponding to a unique address and a unique word in the SRAM array. In some embodiments, the control signals are read/write signals, such that a particular bit value (e.g., L0) represents a read operation, and the complementary bit value (e.g., L1) represents a write operation.

The row decoder 620 decodes the address bits received via the address bus 611, determines the addressed word 200[w] of the SRAM array, and controls the corresponding row line 560[w] and write line 570[w] to initiate a write or read operation on the addressed word 200[w]. In some implementations, the SRAM array 500 is an array of SRAM cells 200u. In such implementations, the row decoder may initiate a write operation by setting the bit values of the row line 560[w] and the write line 570[w] to L0 in a first time period (first stage of the write operation) and L1 in a second, subsequent time period (second stage of the write operation). In such implementations, the row decoder may initiate a read operation by (1) setting the bit values of the row line 560[w] and the write line 570[w] to L0 and L1, respectively, in a first time period (first stage of the read operation), and (2) setting the bit values of the row line 560[w] and the write line 570[w] to L1 in a second, subsequent time period (second stage of the read operation).

In some implementations, the SRAM array 500 is an array of SRAM cells 200d. In such implementations, the row decoder may initiate a write operation by setting the bit values of the row line 560[w] and the write line 570[w] to L1 in a first time period (first stage of the write operation) and L0 in a second, subsequent time period (second stage of the write operation). In such implementations, the row decoder may initiate a read operation by (1) setting the bit values of the row line 560[w] and the write line 570[w] to L1 and L0, respectively, in a first time period (first stage of the read operation), and (2) setting the bit values of the row line 560[w] and the write line 570[w] to L0 in a second, subsequent time period (second stage of the read operation).

The I/O unit 630 provides the bits of an addressed word to the SRAM array 500 during a write operation, and obtains the bits of an addressed word from the SRAM array 500 during a read operation. In some embodiments, the I/O unit 630 provides the bits of an addressed word to the SRAM array via column lines 550 during the second stage of the write operation.

In some implementations, the SRAM array 500 is an array of SRAM cells 200u. In such implementations, the I/O unit 630 may pre-charge the column lines 550 to a suitable voltage during the first stage of the read operation, and read out the bits of the addressed word via the column lines 550 during the second stage of the read operation. In some implementations, the SRAM array 500 is an array of SRAM cells 200d. In such implementations, the I/O unit 630 may pre-discharge the column lines 550 to a suitable voltage during the first stage of the read operation, and read out the bits of the addressed word via the column lines 550 during the second stage of the read operation.

Some embodiments have been described in which an SRAM cell 200 operates asynchronously. Some embodiments of the SRAM cell 200 may operate synchronously, such that the input signals to the SRAM cell 200 are synchronized to a common clock. For example, in the timing diagrams of FIGS. 3A-3D and 4A-4D, the signals on the word line 280, control line 282, and bit line 284 may be synchronized to a clock. The first stage of a write operation (e.g., time periods 304 and 314 in FIGS. 3A and 3B, or time periods 404 and 414 in FIGS. 4A and 4B) may correspond, for example, to the first half of a clock period, and the second stage of the write operation (e.g., time periods 306 and 316 in FIGS. 3A and 3B, or time periods 406 and 416 in FIGS. 4A and 4B) may correspond, for example, to the second half of a clock period. Likewise, the first stage of a read operation (e.g., time periods 324 and 334 in FIGS. 3C and 3D, or time periods 424 and 434 in FIGS. 4C and 4D) may correspond, for example, to the first half of a clock period, and the second stage of the read operation (e.g., time periods 326 and 336 in FIGS. 3C and 3D, or time periods 426 and 436 in FIGS. 4C and 4D) may correspond, for example, to the second half of a clock period.

Some embodiments have been described in which the bit line of an SRAM cell 200 is pre-charged or pre-discharged during the first stage of a read operation, and a pulling device 230 of an SRAM cell 200 is off during the second stage of a read operation, such that the latch 210 does not pull the node 212 toward the power supply rail 270 during the second stage of the read operation. In some embodiments, additional circuitry or an additional control signal may be added to the SRAM cell 200, such that the read operation can be performed in a single stage without pre-charging or pre-discharging the bit line. For example, the additional circuitry or additional control signal may activate the pulling device 230 during the read operation, such that the latch 210 can pull the node 212 toward the power supply rail 270 during the read operation. In such embodiments, the value of the SRAM cell may be read out onto the bit line by activating the access device 250 and placing the bit line 284 in a floating state, without first pre-charging or pre-discharging the bit line 284. The latch 210 can then pull the voltage of the bit line 284 toward the voltage of the node 212, thereby reading out the cell's bit value onto the bit line without disturbing the cell's bit value, even if the bit line 284 was not pre-charged or pre-discharged prior to initiating the read operation.

The phraseology and terminology used herein is for the purpose of description and should not be regarded as limiting.

As would be understood by one of ordinary skill in the art, components of a circuit or electronic device that are coupled to each other may be directly connected (e.g., via a wire) and/or indirectly connected (e.g., via one or more intervening components). Components that are electrically coupled to each other are generally coupled via at least one non-parasitic circuit path (e.g., a circuit path through one or more non-parasitic components (e.g., wires, resistors, capacitors, inductors, drain-source terminals of a transistor, etc.)). For absence of doubt, paths through a parasitic gate-drain capacitance or parasitic gate-source capacitance of a transistor, and the like, are generally parasitic circuit paths.

The term "approximately", the phrase "approximately equal to", and other similar phrases, as used in the specification and the claims (e.g., "X has a value of approximately Y" or "X is approximately equal to Y"), should be understood to mean that one value (X) is within a predetermined range of another value (Y). The predetermined range may be plus or minus 20%, 10%, 5%, 3%, 1%, 0.1%, or less than 0.1%, unless otherwise indicated.

The indefinite articles "a" and "an," as used in the specification and in the claims, unless clearly indicated to the contrary, should be understood to mean "at least one." The phrase "and/or," as used in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" "exactly one of," or, when used in the claims, "consisting of," will refer to the inclusion of exactly one element of a number or list of elements. In general, the term "or" as used shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

The use of "including," "comprising," "having," "containing," "involving," and variations thereof, is meant to encompass the items listed thereafter and additional items.

Use of ordinal terms such as "first," "second," "third," etc., in the claims to modify a claim element does not by itself connote any priority, precedence, or order of one claim element over another or the temporal order in which acts of a method are performed. Ordinal terms are used merely as labels to distinguish one claim element having a certain name from another element having a same name (but for use of the ordinal term), to distinguish the claim elements.

Having thus described several aspects of at least one embodiment of this invention, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A static random-access memory (SRAM) cell, comprising:
   a latch operable to store a bit value at a first node, the latch including first and second devices each having a first voltage reference node coupled to a first power supply rail and a second voltage reference node coupled to a second power supply rail;
   a switch coupled to the first node, wherein a bit line of the SRAM cell is coupled to the first node through first and second terminals of the switch, and a word line of the SRAM cell is coupled to a control terminal of the switch;
   a first pulling device of a first type, wherein the second voltage reference node of the first device of the latch is coupled to the second power supply rail via first and second terminals of the first pulling device; and
   a second pulling device of a second type, wherein the first node is coupled to the first power supply rail via a conductive path that bypasses all transistors of the latch and includes drain and source terminals of the second pulling device,
   wherein a control line is coupled to respective control terminals of the first and second pulling devices.

2. The SRAM cell of claim 1, wherein the second pulling device is operable to selectively pull a voltage of the first node toward a voltage of the first power supply rail.

3. The SRAM cell of claim 1, wherein the first pulling device is operable to selectively pull a voltage of the second voltage reference node of the first device of the latch toward a voltage of the second power supply rail.

4. The SRAM cell of claim 1, further comprising a third pulling device of the second type, wherein the first voltage reference node of the first device of the latch is coupled to the first power supply rail via first and second terminals of the third pulling device.

5. The SRAM cell of claim 4, wherein the third pulling device is operable to selectively pull a voltage of the first voltage reference node of the first device of the latch toward a voltage of the first power supply rail.

6. The SRAM cell of claim 4, wherein a difference between an electrical potential of the first power supply rail and an electrical potential of the second power supply rail is less than a threshold voltage of at least one device selected from the group consisting of the switch, the first pulling device, the second pulling device, and the third pulling device.

7. The SRAM cell of claim 1, wherein the difference between the electrical potential of the first power supply rail and the electrical potential of the second power supply rail is less than a threshold voltage of at least one of the transistors of the latch.

8. The SRAM cell of claim 1, wherein the first type of pulling device is a pull-down type and the second type of pulling device is a pull-up type.

9. The SRAM cell of claim 1, wherein the first type of pulling device is a pull-up type and the second type of pulling device is a pull-down type.

10. A static random-access memory (SRAM) cell, comprising:
    a first plurality of field-effect transistors (FETs) of a first type, including first, second, third, and fourth FETs; and
    a second plurality of field-effect transistors (FETs) of a second type, including fifth, sixth, seventh, and eighth FETs,
    wherein a first diffusion terminal, second diffusion terminal, and gate of the fifth FET are coupled, respectively, to a first power supply rail, a first diffusion terminal of the sixth FET, and a word line, wherein a second diffusion terminal and gate of the sixth FET are coupled, respectively, to a first node and a second node, wherein a first diffusion terminal, second diffusion terminal, and gate of the first FET are coupled, respectively, to the first node, a first diffusion terminal of the second FET, and the second node, wherein a second diffusion terminal and gate of the second FET are coupled, respectively, to a second power supply rail and a control line, wherein a first diffusion terminal, second diffusion terminal, and gate of the third FET are coupled, respectively, to a bit line, the first node, and the word line, wherein a first diffusion terminal, second diffusion terminal, and gate of the seventh FET are coupled, respectively, to the first power supply rail, the first node, and the control line, wherein a first diffusion terminal, second diffusion terminal, and gate of the eighth FET are coupled, respectively, to the first power supply rail, the second node, and the first node, and wherein a first diffusion terminal, second diffusion terminal, and gate of the fourth FET are coupled, respectively, to the second node, the second power supply rail, and the first node.

11. The SRAM cell of claim 10, wherein a difference between an electrical potential of the first power supply rail and an electrical potential of the second power supply rail is less than a threshold voltage of at least one FET selected from the group consisting of the first and second pluralities of FETs.

12. The SRAM cell of claim 10, wherein the first type of FET is an n-channel FET (nFET) and the second type of FET is a p-channel FET (pFET).

13. The SRAM cell of claim 12, wherein the first and second pluralities of FETs are operable to store a bit value at the first node in response to receiving a sequence of control signals, wherein receiving the sequence of control signals includes:

(a) receiving logic-0 values on the control line and the word line during a first time period, and (b) subsequent to step (a), receiving logic-1 values on the control line and the word line during a second time period, and receiving the bit value on the bit line during the second time period.

14. The SRAM cell of claim 13, wherein receiving the sequence of control signals further includes:

prior to step (a), receiving a logic-1 value on the control line and a logic-0 value on the word line during a third time period.

15. The SRAM cell of claim 10, wherein the first type of FET is a p-channel FET (pFET) and the second type of FET is an n-channel FET (nFET).

16. The SRAM cell of claim 15, wherein the first and second pluralities of FETs are operable to store a bit value at the first node in response to receiving a sequence of control signals, wherein receiving the sequence of control signals includes:

(a) receiving logic-1 values on the control line and the word line during a first time period, and (b) subsequent to step (a), receiving logic-0 values on the control line and the word line during a second time period, and receiving the bit value on the bit line during the second time period.

17. The SRAM cell of claim 16, wherein receiving the sequence of control signals further includes:

prior to step (a), receiving a logic-0 value on the control line and a logic-1 value on the word line during a third time period.

18. A method of storing a bit value in a static random-access memory (SRAM) cell, the SRAM cell including a latch and a switch, the latch being operable to store the bit value at a first node, the latch including first and second devices each having a first voltage reference node coupled to a first power supply rail and a second voltage reference node coupled to a second power supply rail, a bit line of the SRAM cell being coupled to the first node through first and second terminals of the switch, a word line of the SRAM cell being coupled to a control terminal of the switch, the method comprising:

(a1) decoupling the second voltage reference node of the first device from the second power supply rail;

(a2) pulling a voltage of the first node toward a voltage of the first power supply rail;

(b1) coupling the second voltage reference node of the first device to the second power supply rail;

(b2) decoupling the first voltage reference node of the first device from the first power supply rail; and (b3) coupling the bit line to the first node, wherein a voltage of the bit line represents the bit value, wherein steps a1 and a2 are performed at least partially in parallel, wherein steps b1, b2, and b3 are performed at least partially in parallel, and wherein steps a1 and a2 are performed prior to steps b1, b2, and b3.

19. The method of claim 18, wherein steps a1, a2, b1, b2, and b3 are collectively performed in a time period between approximately 167 ps and approximately 200 ps.

20. The method of claim 18, wherein pulling the voltage of the first node toward the voltage of the first power supply rail comprises pulling up the voltage of the first node.

21. The method of claim 20, wherein the bit value is a logic-0 value, and wherein the method further comprises:

after coupling the bit line to the first node, pulling down the voltage of the first node to a logic-0 value.

22. The method of claim 20, wherein pulling up the voltage of the first node toward the voltage of the first power supply rail comprises pulling up the voltage of the first node to a voltage representing a logic-1 value.

23. The method of claim 20, wherein the bit value is a logic-1 value, and wherein the method further comprises:

after coupling the bit line to the first node, pulling up the voltage of the first node to a voltage representing a logic-1 value.

24. The method of claim 18, wherein:

the SRAM cell further includes a first pulling device of a first type and a second pulling device of a second type, the second voltage reference node of the first device of the latch is coupled to the second power supply rail via first and second terminals of the first pulling device, the first node is coupled to the first power supply rail via first and second terminals of the second pulling device, a control line is coupled to respective control terminals of the first and second pulling devices, and steps a1 and a2 are performed in response to receiving, during a first time period, a logic-0 value on the control line and a logic-0 value on the word line.

25. The method of claim 18, wherein pulling the voltage of the first node toward the voltage of the first power supply rail comprises pulling down the voltage of the first node.

26. The method of claim 25, wherein the bit value is a logic-1 value, and wherein the method further comprises:

after coupling the bit line to the first node, pulling up the voltage of the first node to a logic-1 value.

27. The method of claim 25, wherein pulling down the voltage of the first node toward the voltage of the first power supply rail comprises pulling down the voltage of the first node to a voltage representing a logic-0 value.

28. The method of claim 25, wherein the bit value is a logic-0 value, and wherein the method further comprises:
after coupling the bit line to the first node, pulling down the voltage of the first node to a voltage representing a logic-0 value.

29. The method of claim 18, wherein:
the SRAM cell further includes a first pulling device of a first type and a second pulling device of a second type,
the second voltage reference node of the first device of the latch is coupled to the second power supply rail via first and second terminals of the first pulling device,
the first node is coupled to the first power supply rail via first and second terminals of the second pulling device,
a control line is coupled to respective control terminals of the first and second pulling devices, and
steps a1 and a2 are performed in response to receiving, during a first time period, a logic-1 value on the control line and a logic-1 value on the word line.

30. A static random-access memory (SRAM) device, comprising:
an array of SRAM cells organized in rows and columns, wherein each of the SRAM cells comprises:
a latch operable to store a bit value at a first node, the latch including first and second devices each having a first voltage reference node coupled to a first power supply rail and a second voltage reference node coupled to a second power supply rail,
a switch coupled to the first node,
a bit line coupled to the first node through first and second terminals of the switch,
a word line coupled to a control terminal of the switch,
a first pulling device of a first type, wherein the second voltage reference node of the first device of the latch is coupled to the second power supply rail via first and second terminals of the first pulling device,
a second pulling device of a second type, wherein the first node is coupled to the first power supply rail via a conductive path that bypasses all transistors of the latch and includes source and drain terminals of the second pulling device, and
a control line coupled to respective control terminals of the first and second pulling devices;
a plurality of column lines, each column line corresponding to a respective column of the SRAM cells and coupled to the bit lines of the SRAM cells in the respective column;
a plurality of row lines, each row line corresponding to a respective row of the SRAM cells and coupled to the word lines of the SRAM cells in the respective row;
a plurality of write lines, each write line corresponding to a respective row of the SRAM cells and coupled to the control lines of the SRAM cells in the respective row; and
a memory controller coupled to the SRAM array via the column lines, row lines, and write lines.

* * * * *